(12) United States Patent
Nakagawa et al.

(10) Patent No.: US 11,749,507 B2
(45) Date of Patent: *Sep. 5, 2023

(54) SEMICONDUCTOR MANUFACTURING APPARATUS MEMBER AND SEMICONDUCTOR MANUFACTURING APPARATUS

(71) Applicant: TOTO LTD., Kitakyushu (JP)

(72) Inventors: Ryunosuke Nakagawa, Kitakyushu (JP); Tatsuya Koga, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/701,855

(22) Filed: Mar. 23, 2022

(65) Prior Publication Data
US 2022/0344125 A1    Oct. 27, 2022

(30) Foreign Application Priority Data

Apr. 21, 2021  (JP) .................................. 2021-072042
Jan. 27, 2022  (JP) .................................. 2022-011206

(51) Int. Cl.
*H01J 37/32* (2006.01)

(52) U.S. Cl.
CPC ...... *H01J 37/3244* (2013.01); *H01J 37/3288* (2013.01); *H01J 2237/334* (2013.01); *H01J 2237/3321* (2013.01)

(58) Field of Classification Search
CPC ........... H01L 21/67011; H01L 21/6831; H01L 21/67; H01J 37/3244; H01J 37/32477;
(Continued)

(56) References Cited

U.S. PATENT DOCUMENTS 6,267,307 B1 *  7/2001  Pontoppidan .......... F02M 61/06
                                                    239/585.4
6,383,964 B1 *  5/2002  Nakahara ................ C04B 35/18
                                                    501/127
(Continued)

FOREIGN PATENT DOCUMENTS

JP          2000-058510 A       2/2000
JP          2002-110655 A       4/2002
(Continued)

*Primary Examiner* — Brook Kebede
(74) *Attorney, Agent, or Firm* — Carrier, Shende & Associated P.C.; Joseph P. Carrier; Fulchand P. Shende

(57) ABSTRACT

According to one embodiment, a semiconductor manufacturing apparatus member is used inside a chamber of a semiconductor manufacturing apparatus. The member includes a base material and a ceramic layer. The base material includes a first surface, a second surface, and at least one hole. The at least one hole extends through the first and second surfaces. The ceramic layer is located on the first surface. The at least one hole includes an oblique surface and a perpendicular surface. The oblique surface is continuous with the first surface and is oblique to a first direction from the first surface toward the second surface. The perpendicular surface is positioned between the second surface and the oblique surface in the first direction and extends along the first direction. An angle between the first surface and the oblique surface is greater than an angle between the perpendicular surface and the oblique surface.

10 Claims, 7 Drawing Sheets

(58) Field of Classification Search
CPC . H01J 37/32715; H01J 37/3288; C23C 28/04; C23C 16/4583
See application file for complete search history.

(56) References Cited

U.S. PATENT DOCUMENTS

| | | |
|---|---|---|
| 2012/0037596 A1 | 2/2012 | Eto et al. |
| 2012/0040132 A1 | 2/2012 | Eto et al. |
| 2014/0053866 A1 | 2/2014 | Baluja et al. |
| 2014/0174662 A1 | 6/2014 | Kitajima et al. |
| 2016/0010200 A1 | 1/2016 | Mitsuhashi et al. |
| 2018/0301321 A1 | 10/2018 | Iwasawa |
| 2018/0337023 A1 | 11/2018 | Ikeda et al. |
| 2019/0027343 A1 | 1/2019 | Nitta |
| 2019/0362947 A1 | 11/2019 | Nezu et al. |
| 2020/0273675 A1 | 8/2020 | Nitta et al. |

FOREIGN PATENT DOCUMENTS

| | | |
|---|---|---|
| JP | 2012-057251 A | 3/2012 |
| JP | 2012-060101 A | 3/2012 |
| JP | 2013-041872 A | 2/2013 |
| JP | 2015-529395 A | 10/2015 |
| JP | 2016-028379 A | 2/2016 |
| JP | 2017-014569 A | 1/2017 |
| JP | 2017-114724 A | 6/2017 |
| JP | 2018-046278 A | 3/2018 |
| JP | 2018-107313 A | 7/2018 |
| JP | 2019-207912 A | 12/2019 |
| JP | 2020-141128 A | 9/2020 |
| KR | 2012-0126018 A | 11/2012 |
| KR | 2018-0076325 A | 7/2018 |
| KR | 2018-0125896 A | 11/2018 |
| WO | 2014/116304 A2 | 7/2014 |

\* cited by examiner

| | ARITHMETICAL MEAN HEIGHT Sa(μm) | | | RATIO | | PARTICLE RESISTANCE |
|---|---|---|---|---|---|---|
| | FIRST PART | SECOND PART | THIRD HOLE PART | R21 (SECOND PART/ FIRST PART) | R31 (THIRD HOLE PART /FIRST PART) | |
| SAMPLE 1 | 0.03 | 0.06 | 0.2 | 2.0 | 6.7 | ◎ |
| SAMPLE 2 | 0.03 | 0.12 | 0.5 | 4.0 | 16.7 | ◎ |
| SAMPLE 3 | 0.06 | 0.35 | 0.3 | 5.8 | 5.0 | ○ |
| SAMPLE 4 | 0.08 | 0.81 | 0.85 | 10.1 | 10.6 | × |
| SAMPLE 5 | 0.15 | 0.41 | 0.2 | 2.7 | 1.3 | × |

FIG. 8

SEMICONDUCTOR MANUFACTURING APPARATUS MEMBER AND SEMICONDUCTOR MANUFACTURING APPARATUS

CROSS-REFERENCE TO RELATED APPLICATIONS

This application is based upon and claims the benefit of priority from Japanese Patent Application No. 2021-072042, filed on Apr. 21, 2021, and No. 2022-011206, filed on Jan. 27, 2022; the entire contents of which are incorporated herein by reference.

FIELD

Embodiments described herein relate generally to a semiconductor manufacturing apparatus member and a semiconductor manufacturing apparatus.

BACKGROUND

A semiconductor manufacturing apparatus is used in a manufacturing process of a semiconductor device to perform plasma processing of a patterning object such as a semiconductor wafer, etc. There are cases where a semiconductor manufacturing apparatus member that contacts the plasma and includes at least one hole is located inside such a semiconductor manufacturing apparatus. There are cases where particles are produced from such a semiconductor manufacturing apparatus member. It is desirable to reduce the production or effects of the particles because the particles reduce the yield of the semiconductor device to be manufactured.

SUMMARY

According to the embodiment, a semiconductor manufacturing apparatus member is used inside a chamber of a semiconductor manufacturing apparatus. The member includes a base material and a ceramic layer. The base material includes a first surface, a second surface, and at least one hole. The second surface is at a side opposite to the first surface. The at least one hole extends through the first and second surfaces. The ceramic layer is located on at least the first surface of the base material. The ceramic layer is exposed. The at least one hole includes an oblique surface and a perpendicular surface. The oblique surface is continuous with the first surface and is oblique to a first direction. The first direction is from the first surface toward the second surface. The perpendicular surface is positioned between the second surface and the oblique surface in the first direction and extends along the first direction. An angle between the first surface and the oblique surface is greater than an angle between the perpendicular surface and the oblique surface.

BRIEF DESCRIPTION OF THE DRAWINGS

FIG. 8 is a table illustrating an evaluation of the particle resistance of the semiconductor manufacturing apparatus member.

DETAILED DESCRIPTION

Figure 1:
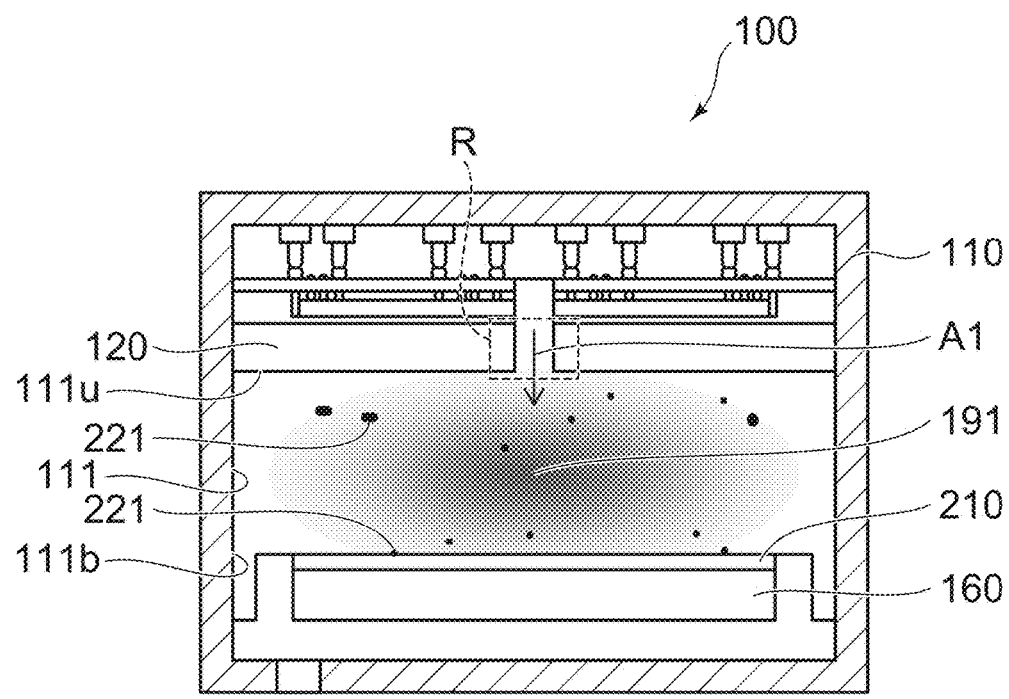
FIG. 1 is a cross-sectional view illustrating a semiconductor manufacturing apparatus that includes a semiconductor manufacturing apparatus member according to a first embodiment.

A first invention is a semiconductor manufacturing apparatus member used inside a chamber of a semiconductor manufacturing apparatus, and the semiconductor manufacturing apparatus member includes a base material and a ceramic layer; the base material includes a first surface, a second surface at a side opposite to the first surface, and at least one hole extending through the first and second surfaces; the ceramic layer is located on at least the first surface of the base material and is exposed; the at least one hole includes an oblique surface and a perpendicular surface; the oblique surface is continuous with the first surface and is oblique to a first direction; the first direction is from the first surface toward the second surface; the perpendicular surface is positioned between the second surface and the oblique surface in the first direction and extends along the first direction; and an angle between the first surface and the oblique surface is greater than an angle between the perpendicular surface and the oblique surface.

According to the semiconductor manufacturing apparatus member, by setting the angle between the first surface and the oblique surface to be relatively large, plasma concentration at the edge part vicinity formed by the first surface and the oblique surface can be relaxed, and the production of particles can be suppressed. Also, by setting the angle between the perpendicular surface and the oblique surface to be relatively small, the penetration of the plasma into the hole interior can be more effectively suppressed.

A second invention is the semiconductor manufacturing apparatus member of the first invention, wherein the angle between the first surface and the oblique surface is not less than 160° and not more than 180°.

According to the semiconductor manufacturing apparatus member, the plasma concentration at the edge part vicinity formed by the first surface and the oblique surface can be more relaxed, and the production of particles can be further suppressed.

A third invention is the semiconductor manufacturing apparatus member of the first or second invention, wherein the angle between the perpendicular surface and the oblique surface is greater than 90° and not more than 105°.

According to the semiconductor manufacturing apparatus member, the penetration of the plasma into the hole interior can be more effectively suppressed.

A fourth invention is the semiconductor manufacturing apparatus member of any one of the first to third inventions, wherein the ceramic layer includes a polycrystalline ceramic.

According to the semiconductor manufacturing apparatus member, the production or effects of the particles can be more reliably reduced.

A fifth invention is the semiconductor manufacturing apparatus member of the fourth invention, wherein an average crystallite size of the polycrystalline ceramic calculated using a TEM image having a magnification of 400,000 times to 2,000,000 times is not less than 3 nanometers and not more than 50 nanometers.

According to the semiconductor manufacturing apparatus member, the production or effects of the particles can be more reliably reduced.

A sixth invention is the semiconductor manufacturing apparatus member of any one of the first to fifth inventions, wherein the ceramic layer includes at least one selected from the group consisting of an oxide of a rare-earth element, a fluoride of a rare-earth element, and an acid fluoride of a rare-earth element.

According to the semiconductor manufacturing apparatus member, the production or effects of the particles can be more reliably reduced.

A seventh invention is the semiconductor manufacturing apparatus member of the sixth invention, wherein the rare-earth element is at least one selected from the group consisting of Y, Sc, Yb, Ce, Pr, Eu, La, Nd, Pm, Sm, Gd, Tb, Dy, Ho, Er, Tm, and Lu.

According to the semiconductor manufacturing apparatus member, the production or effects of the particles can be more reliably reduced.

An eighth invention is the semiconductor manufacturing apparatus member of any one of the first to seventh inventions, wherein the base material includes a ceramic.

According to the semiconductor manufacturing apparatus member, the production or effects of the particles can be more reliably reduced.

A ninth invention is the semiconductor manufacturing apparatus member of the eighth invention, wherein the base material includes alumina.

According to the semiconductor manufacturing apparatus member, the production or effects of the particles can be more reliably reduced.

A tenth invention is a semiconductor manufacturing apparatus that includes a chamber and the semiconductor manufacturing apparatus member according to any one of the first to tenth inventions, wherein the chamber includes an interior wall that defines a space in which plasma is generated, and the ceramic layer of the semiconductor manufacturing apparatus member is included in at least a portion of the interior wall.

According to the semiconductor manufacturing apparatus, the production or effects of the particles can be reduced.

According to aspects of the invention, a semiconductor manufacturing apparatus member and a semiconductor manufacturing apparatus are provided in which the production or effects of the particles can be reduced.

Exemplary embodiments will now be described with reference to the drawings. Similar components in the drawings are marked with like reference numerals; and a detailed description is omitted as appropriate.

The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions.

First Embodiment

FIG. 1 is a cross-sectional view illustrating a semiconductor manufacturing apparatus that includes a semiconductor manufacturing apparatus member according to a first embodiment.

The semiconductor manufacturing apparatus 100 illustrated in FIG. 1 includes a chamber 110, a semiconductor manufacturing apparatus member 120, and an electrostatic chuck 160. The electrostatic chuck 160 is located in the lower part inside the chamber 110. An object to be held such as a wafer 210 or the like is placed on the electrostatic chuck 160. In the example, the semiconductor manufacturing apparatus member 120 is located in the upper part inside the chamber 110. For example, the semiconductor manufacturing apparatus member 120 is a top plate member of the chamber 110 positioned directly above the electrostatic chuck 160 and the wafer 210 inside the chamber 110.

The chamber 110 includes an interior wall 111 that forms a space (a region 191) in which the plasma is generated. A ceramic layer 20 at the surface of the semiconductor manufacturing apparatus member 120 (see FIG. 2) is included in at least a portion of the interior wall 111. In the example, the interior wall 111 includes a lower interior wall 111$b$ at which the electrostatic chuck 160 is located, and an upper interior wall 111$u$ located higher than the lower interior wall 111$b$. The ceramic layer 20 of the semiconductor manufacturing apparatus member 120 is located on at least a portion of the upper interior wall 111$u$.

In the semiconductor manufacturing apparatus 100, high frequency power is supplied; and, for example, a raw material gas such as a halogen-based gas or the like is introduced to the interior of the chamber 110 as in arrow A1 illustrated in FIG. 1. Then, the raw material gas that is introduced to the interior of the chamber 110 is plasmatized in the region 191 between the electrostatic chuck 160 and the semiconductor manufacturing apparatus member 120.

Here, there are cases where particles 221 are produced when the interior wall of the chamber 110 is corroded by the plasma. If the particles 221 adhere to the wafer 210, there are cases where a discrepancy occurs in the manufactured semiconductor device. Then, there are cases where the yield of the semiconductor device and the productivity degrade. Therefore, plasma resistance of the semiconductor manufacturing apparatus member 120 is necessary.

The semiconductor manufacturing apparatus member according to the embodiment may be a member located at a position other than the upper part inside the chamber. The semiconductor manufacturing apparatus in which the semiconductor manufacturing apparatus member is used is not limited to the example of FIG. 1 and includes any semiconductor manufacturing apparatus (semiconductor processing apparatus) performing processing such as annealing, etching, sputtering, CVD (Chemical Vapor Deposition), etc.

The semiconductor manufacturing apparatus member according to the embodiment can be favorably used as various members in a semiconductor manufacturing apparatus, and especially as members used in an environment exposed to a corrosive high density plasma atmosphere. Specifically, a chamber wall, a shower plate, a liner, a shield, a window, an edge ring, a focus ring, etc., are examples.

Figure 2:
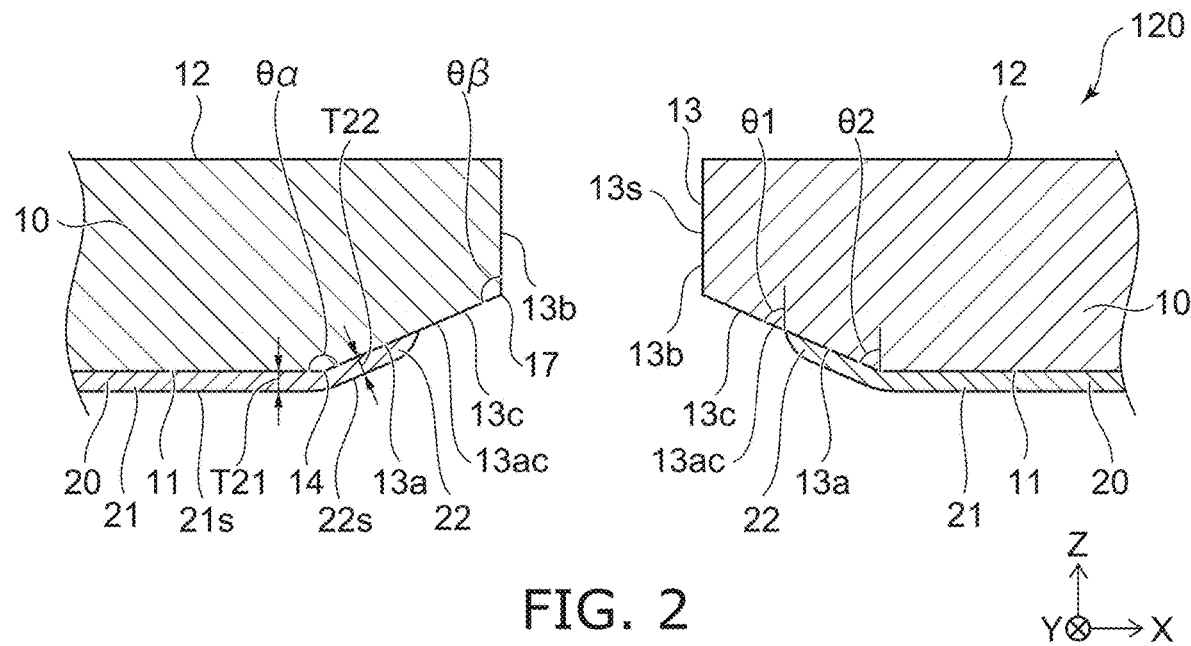
FIG. 2 is a cross-sectional view illustrating a portion of the semiconductor manufacturing apparatus member according to the first embodiment.

FIG. 2 is a cross-sectional view illustrating a portion of the semiconductor manufacturing apparatus member according to the first embodiment.

FIG. 2 shows an enlargement of a region R vicinity illustrated in FIG. 1.

The semiconductor manufacturing apparatus member 120 includes a base material 10 and the ceramic layer 20. The base material 10 includes a first surface 11, and a second surface 12 at the side opposite to the first surface 11. The first surface 11 faces the interior of the chamber 110 shown in FIG. 1, and the second surface 12 faces out of the chamber 110. At least one hole 13 is provided in the base material 10. The hole 13 extends through the base material 10 from the first surface 11 to the second surface 12.

In the example, the base material 10 is, for example, plate-shaped (discal). The first surface 11 and the second surface 12 each are, for example, planes. However, the first surface 11 and the second surface 12 may be curved surfaces. One hole 13 is located at the center of the base material 10. For example, a member such as an injector or the like that injects the raw material gas of the plasma is located at the hole 13. The raw material gas of the plasma passes through the hole 13 and is introduced to the interior of the chamber 110. However, the hole 13 may not be a hole that supplies the raw material gas for plasma generation into the chamber 110, and may be any hole that extends through the base material 10. The hole 13 may not be at the center of the base material 10; and multiple holes 13 may be provided.

The direction from the first surface 11 toward the second surface 12 is taken as a Z-direction (a first direction). One direction perpendicular to the Z-direction is taken as an X-direction; and a direction perpendicular to the Z-direction and the X-direction is taken as a Y-direction. For example, the first surface 11 and the second surface 12 are perpendicular to the Z-direction and extend along the X-Y plane.

The hole 13 (an inner perimeter surface 13s of the hole) includes a first hole part 13a, a second hole part 13b, and a third hole part 13c. The hole 13 is, for example, circular when viewed along the Z-direction. The inner perimeter surface 13s is the inner perimeter surface of the base material 10 that defines the hole 13. The inner perimeter surface 13s faces the interior of the hole 13 and crosses the X-Y plane.

The first hole part 13a is a region of the inner perimeter surface 13s that is positioned at the vicinity of the first surface 11 and is next to the first surface 11. The first hole part 13a is continuous with the first surface 11. The first hole part 13a is positioned between the first surface 11 and the second surface 12 in the Z-direction. The first hole part 13a is an oblique surface that is not parallel to the first surface 11 and crosses the first surface 11 and the Z-direction. The first hole part 13a may be a surface that extends parallel to the Z-direction. In the example, the first hole part 13a has a straight-line shape in a cross section parallel to the Z-direction such as in FIG. 2. However, in the cross section parallel to the Z-direction, the first hole part 13a may not have a straight-line shape and may be, for example, curved. When viewed along the Z-direction (i.e., when projected onto the X-Y plane), for example, the first hole part 13a has a ring shape surrounded with the first surface 11.

In the example, a boundary 14 at which the first surface 11 and the first hole part 13a contact is a corner in the cross section parallel to the Z-direction. However, the first surface 11 and the first hole part 13a may be smoothly connected. In other words, in the cross section of FIG. 2, the boundary 14 may be rounded or curved, and may have a curvature.

The second hole part 13b is positioned between the first hole part 13a and the second surface 12 in the Z-direction. In other words, the Z-direction position of the second hole part 13b is between the Z-direction position of the first hole part 13a and the Z-direction position of the second surface 12. For example, the second hole part 13b is a region of the inner perimeter surface 13s that is positioned at the vicinity of the second surface 12 and is next to the second surface 12. Also, the second hole part 13b may be continuous with the second surface 12. The second hole part 13b extends in the Z-direction and is, for example, parallel to the Z-direction. For example, the second hole part 13b is included in a perpendicular surface that is substantially perpendicular to the second surface 12. When viewed along the Z-direction, for example, the second hole part 13b has a ring shape positioned inside the first hole part 13a.

The third hole part 13c is positioned between the first hole part 13a and the second hole part 13b in the Z-direction. In other words, the Z-direction position of the third hole part 13c is between the Z-direction position of the first hole part 13a and the Z-direction position of the second hole part 13b. The third hole part 13c is a region of the inner perimeter surface 13s that is continuous with the first hole part 13a. The third hole part 13c is an oblique surface that is not parallel to the first surface 11 and crosses the first surface 11 and the Z-direction. The third hole part 13c may be a surface that extends in the Z-direction. In the example, the third hole part 13c has a straight-line shape in the cross section parallel to the Z-direction. However, in the cross section parallel to the Z-direction, the third hole part 13c may not have a straight-line shape and may be, for example, curved. When viewed along the Z-direction, for example, the third hole part 13c has a ring shape that is surrounded with the first hole part 13a and contacts the first hole part 13a; and the second hole part 13b is positioned inward of the third hole part 13c. The third hole part 13c and the second hole part 13b may be continuous.

In the example, the direction in which the first hole part 13a extends and the direction in which the third hole part 13c extends are on the same straight line in the cross section parallel to the Z-direction. In other words, an angle $\theta 1$ between the third hole part 13c and the Z-direction is equal to an angle $\theta 2$ between the first hole part 13a and the Z-direction. However, the angle $\theta 1$ and the angle $\theta 2$ may be different from each other.

In the example, a boundary 17 at which the second hole part 13b and the third hole part 13c contact is a corner in the cross section parallel to the Z-direction. However, the second hole part 13b and the third hole part 13c may be smoothly connected. In other words, the boundary 17 in the cross section of FIG. 2 may be rounded or curved, and may have a curvature.

The hole 13 (the inner perimeter surface 13s of the hole) also includes an oblique surface 13ac. The oblique surface 13ac is, for example, a surface that includes the first and third hole parts 13a and 13c. The oblique surface 13ac is continuous with the first surface 11 and is oblique to the first surface 11 and the Z-direction. The oblique surface 13ac is continuous with the perpendicular surface (the second hole part 13b) and connects the first surface 11 and the second hole part 13b. In the example, the oblique surface 13ac that is formed of the first and third hole parts 13a and 13c has a straight-line shape in the cross section parallel to the Z-direction. However, the oblique surface 13ac may be curved.

An angle $\theta\alpha$ between the first surface 11 and the oblique surface 13ac is greater than an angle $\theta\beta$ between the second hole part 13b (the perpendicular surface) and the oblique surface 13ac. For example, the angle $\theta\alpha$ is the angle between the first surface 11 and the first hole part 13a; and the angle $\theta\beta$ is the angle between the second hole part 13b and the third hole part 13c.

The plasma corrosion resistance of the ceramic layer 20 is greater than the plasma corrosion resistance of the base material 10. The ceramic layer 20 is located on the base material 10. More specifically, as shown in FIG. 2, the ceramic layer 20 includes a first part 21 and a second part 22. The first part 21 is located on the first surface 11 and contacts the first surface 11. The first part 21 is located over substantially the entire first surface 11. The second part 22 is located on the first hole part 13a and contacts the first hole part 13a. A surface 21s of the first part 21 and a surface 22s of the second part directly contact the plasma inside the chamber 110. That is, the surface 21s is at a side opposite to the surface of the first part 21 contacting the first surface 11, and is exposed inside the chamber 110. The surface 22s is at the side opposite to the surface of the second part 22 contacting the first hole part 13a, and is exposed inside the chamber 110. The first surface 11 is covered with the first part 21 and therefore does not directly contact the plasma. The first hole part 13a is covered with the second part 22 and therefore does not directly contact the plasma. That is, the first surface 11 and the first hole part 13a are covered with the ceramic layer 20; and the ceramic layer 20 is configured to be exposed to the plasma. The surface 21s is, for example, a plane that is parallel to the X-Y plane. The surface 21s may be a curved surface. The surface 22s is an oblique surface that crosses the surface 21s and the Z-direction. The surface 21s may extend in the Z-direction.

The ceramic layer 20 is not located on the second surface 12, on the second hole part 13b, or on the third hole part 13c. In other words, in the example, the region of the inner perimeter surface 13s of the hole 13 at which the ceramic layer 20 is located is the first hole part 13a; and the region of the inner perimeter surface 13s at which the ceramic layer 20 is not located is the second and third hole parts 13b and 13c. The third hole part 13c contacts the edge of the second part 22. The second hole part 13b and the third hole part 13c are exposed to the plasma inside the chamber 110 and directly contact the plasma. The second hole part 13b and the third hole part 13c are not covered with the ceramic layer 20.

The arithmetical mean height Sa of the surface 21s of the first part 21 is less than the arithmetical mean height Sa of the surface 22s of the second part 22. The arithmetical mean height Sa (the surface roughness) can be evaluated by methods described below. For example, the surface roughness of the first part 21 (the roughness of the surface 21s) is less than the surface roughness of the second part 22 (the roughness of the surface 22s).

As described above, it is desirable for a semiconductor manufacturing apparatus member that contacts plasma to be plasma-resistant to reduce particles. Therefore, a conventional method includes coating the surface of the semiconductor manufacturing apparatus member with a coating (a layer) that has excellent plasma resistance. However, even if a coating that has high plasma resistance (e.g., $Y_2O_3$, etc.) coats the greater part of the semiconductor manufacturing apparatus member (e.g., the top plate member) other than the holes, there is a risk that recent demands for reducing the particles will not be sufficiently satisfied. Therefore, for example, it is desirable also to control the particles from the holes. It is considered that particles from the holes may include, for example, particles produced by the detachment of portions of the coating located in the holes, particles from a member (e.g., an injector) located in a hole, etc.

Conversely, according to the embodiment, the ceramic layer 20 is located at the first hole part 13a and the first surface 11 of the base material 10; and the arithmetical mean height Sa of the surface 21s of the first part 21 on the first surface 11 is less than the arithmetical mean height Sa of the surface 22s of the second part 22 on the first hole part 13a. The production or effects of the particles can be reduced thereby.

For example, by setting the arithmetical mean height Sa (the surface roughness) of the surface 21s of the first part 21 contacting the corrosive plasma to be relatively small, the production of particles from the first part 21 can be effectively suppressed. In other words, for example, the first part has a smooth structure; and the production of particles and cracks that start from an unevenness of the first part 21 can be suppressed. For example, the particles that detach from the ceramic layer 20 when a portion of the first part 21 is corroded by the plasma can be suppressed.

Also, the production or effects of the particles from the hole 13 can be suppressed by setting the arithmetical mean height Sa (the surface roughness) of the surface 22s of the second part 22 on the first hole part 13a to be relatively large. For example, it is considered that there are cases where the effects of the electric field on the second part 22 are greater than on the first part 21 because the second part 22 is located on the first hole part 13a. That is, when the first part 21 that is located on the first surface 11 is exposed to the plasma, there are cases where the electric field concentrates more easily at the second part 22 on the first hole part 13a than at the first part 21 because the second part 22 is at the edge vicinity of the hole 13. The damage due to the plasma at the part at which the electric field concentrates is large because the electric field intensity is large and the plasma is concentrated. There is a risk that the damaged part may detach from the ceramic layer 20 and produce particles. Conversely, according to the embodiment, by setting the arithmetical mean height Sa of the surface 22s of the second part 22 to be relatively large, the surface area of the second part 22 can be increased, and the concentration of the electric field can be relaxed.

By setting the arithmetical mean height Sa of the surface 22s of the second part 22 located at the edge vicinity (the outlet vicinity) of the hole 13 to be relatively large, the particles that are produced from the hole 13 can be caught by the second part 22; and the effects of the particles can be more effectively suppressed.

When a plasma generation gas passes through the hole 13, the temperature at the hole periphery is changed by the injection of the gas. Therefore, there is a risk that the thermal stress of the second part 22 may be greater than the thermal stress of the first part 21. There is a risk that cracks and/or particles may be produced in the second part 22 by the thermal stress. Conversely, by setting the arithmetical mean height Sa of the surface 22s of the second part 22 to be relatively large, the surface area of the second part 22 can be large, and the heat dispersion (heat dissipation) effect of the second part 22 can be increased. The occurrence of cracks and/or particles of the second part 22 can be suppressed thereby.

For example, it is desirable for the surface roughness of the second part 22 to be not less than 2 times and not more than 10 times, and more favorably not more than 5 times the surface roughness of the first part. It is desirable for the arithmetical mean height Sa of the surface 22s of the second part 22 to be not less than 2 times and not more than 10 times, and more favorably not more than 5 times the arithmetical mean height Sa of the surface 21s of the first part 21. The arithmetical mean height Sa of the surface 22s of the second part 22 is, for example, less than 0.5 micrometers (μm) and, for example, not less than 0.005 μm. The arithmetical mean height Sa of the surface 21s of the first part 21 is, for example, less than 0.1 μm and, for example, not less than 0.001 μm. According to such a configuration, the production or effects of the particles can be more reliably reduced.

For example, the surface roughness of the third hole part 13c is greater than the surface roughness of the first part 21 and greater than the surface roughness of the second part 22. For example, the arithmetical mean height Sa of the third hole part 13c is greater than the arithmetical mean height Sa of the surface 21s of the first part 21 and greater than the arithmetical mean height Sa of the surface 22s of the second part 22.

In the example as described above, the ceramic layer 20 is not located on the third hole part 13c; and the inner wall of the hole 13 is exposed. That is, the third hole part 13c is the boundary part between the ceramic layer 20 and the inner wall of the hole 13 and is the base material end part contacting the plasma. By setting the arithmetical mean height Sa (the surface roughness) of such a base material end part (third hole part 13c) to be relatively large, the surface area of the base material end part can be increased, and the concentration of the electric field at the base material end part can be relaxed. For example, the plasma damage due to the electric field concentration at the base material end part can be suppressed, and the production of particles from the base material end part can be suppressed thereby.

For example, it is desirable for the surface roughness of the third hole part 13c to be greater than 2 times the surface roughness of the first part 21. It is also favorable for the surface roughness of the third hole part 13c to be not more than 10 times the surface roughness of the first part 21. It is desirable for the arithmetical mean height Sa of the third hole part 13c to be greater than 2 times the arithmetical mean height Sa of the surface 21s of the first part 21. It is also favorable for the arithmetical mean height Sa of the third hole part 13c to be not more than 10 times the arithmetical mean height Sa of the surface 21s of the first part 21. According to such a configuration, the production or effects of the particles can be more reliably reduced.

The surface roughness of the third hole part 13c may be greater than the surface roughness of the first part 21 and less than the surface roughness of the second part 22. For example, the arithmetical mean height Sa of the third hole part 13c may be greater than the arithmetical mean height Sa of the surface 21s of the first part 21 and less than the arithmetical mean height Sa of the surface 22s of the second part 22.

There are cases where particles are easily produced from the base material 10 because the plasma and the base material 10 directly contact at the third hole part 13c. Conversely, according to the embodiment, the third hole part 13c is positioned more distant to the first and second surfaces 11 and 12 compared to the first and second hole parts 13a and 13b. Furthermore, the production of particles from the third hole part 13c can be further reduced when the arithmetical mean height Sa of the third hole part 13c is less than the arithmetical mean height Sa of the surface of the second part 22. In other words, for example, the occurrence of cracks and/or particles starting from the unevenness of the third hole part 13c can be suppressed. Particles that are generated by a portion of the third hole part 13c detaching from the base material 10 can be suppressed.

As described above, when the base material 10 is corroded by contact with the plasma, there is a risk that fine particles may be produced from the base material 10, and the yield of the semiconductor device to be manufactured may be reduced. Therefore, the surface of the base material 10 that contacts the plasma is covered with a ceramic layer that has higher plasma corrosion resistance than the base material 10. For example, the hole 13 that is provided in the base material 10 includes a perpendicular surface that is perpendicular to the first and second surfaces of the base material 10; however, there are cases where particles are produced from the hole 13 by a portion of the plasma flowing around inside the hole 13 and corroding the inner wall of the hole 13. Therefore, a method may be considered in which a ceramic layer having high plasma corrosion resistance is located at the inner wall (e.g., the perpendicular surface) of the hole 13 as well. However, for example, there is a possibility that the ceramic layer inside the hole 13 may be relatively fragile, and particles may be produced if the fragile ceramic layer is corroded by the plasma. Also, there are cases where plasma concentration easily occurs at the oblique surfaces (the first hole part 13a and the third hole part 13c) between the first surface 11 and the second hole part 13b.

Conversely, according to the embodiment, in the oblique surface 13ac that is formed of the first and third hole parts 13a and 13c, the second part 22 of the ceramic layer 20 is located at the first hole part 13a that is relatively proximate to the first part 21 that contacts the plasma. The production of particles from the first hole part 13a can be effectively suppressed thereby. On the other hand, the third hole part 13c of the oblique surface 13ac that is relatively distant to the first part 21 contacts the plasma. In other words, the third hole part 13c that is distant to the first part 21 and has a relatively low plasma corrosion risk compared to the first hole part 13a is not covered with the ceramic layer 20; and the base material 10 directly contacts the plasma at the third hole part 13c. Particles that are produced from the ceramic layer when the ceramic layer having degraded characteristics is formed at the third hole part 13c can be effectively suppressed thereby.

When the oblique surface 13ac is curved in the cross section parallel to the Z-direction, there are cases where the electric field is concentrated and particles are produced at the oblique surface 13ac or the ceramic layer 20 on the oblique surface 13ac. Conversely, when the oblique surface 13ac has a straight-line shape in the cross section parallel to the Z-direction, the oblique surface 13ac or the electric field concentration at the ceramic layer 20 on the oblique surface 13ac can be more relaxed.

For example, the second part 22 of the ceramic layer 20 is thinner than the first part 21. In other words, a thickness T22 of the second part 22 is less than a thickness T21 of the first part 21. By setting the first part 21 that is easily exposed to the plasma to be thicker than the second part 22, the production of particles from the first surface 11 can be further suppressed. On the other hand, by setting the second part 22 that is exposed to the plasma less easily than the first part 21 to be relatively thin, for example, the collapse of the ceramic layer 20 at the second part 22 can be suppressed and the production of particles can be further suppressed. For example, by setting the film thickness of the second part to be thin, the strain and/or the internal stress in the film can be relaxed, and the collapse of the film can be suppressed.

The thickness of the ceramic layer 20 is the distance from the surface of the base material 10 to the surface of the ceramic layer 20. Specifically, the thicknesses (thicknesses T11 and T22) of the ceramic layer 20 are determined as follows. The thickness of the ceramic layer 20 is determined by cutting the semiconductor manufacturing apparatus member 120 parallel to the Z-direction as in FIG. 2 and observing the fracture surface by using a scanning electron microscope (SEM). For example, the thickness T21 of the first part 21 is the length from the first surface 11 to the surface 21s along a direction perpendicular to the first surface 11. For example, the thickness T22 of the second part 22 is the length from the first hole part 13a to the surface 22s along a direction perpendicular to the first hole part 13a. For example, SEM may be performed using the HITACHI S-5500 and the SEM observation conditions of a magnification of 5000 times and an acceleration voltage of 15 kV. When there is fluctuation of the thickness in the cross-sectional image, measurements are performed at multiple locations, and the average value of the measurements is calculated. A known method can be utilized to make the thickness T22 of the second part 22 less than the thickness T21 of the first part 21, e.g., the film formation times can be different (the film formation time of the second part is set to be less than the film formation time of the first part), the polishing amounts are different (the polishing amount of the second part is set to be greater than the polishing amount of the first part), etc.

The edge part (the boundary 14) that is formed of the first surface 11 and the oblique surface 13ac is positioned proximate to the plasma irradiation surface (the surface 21s). Therefore, there are cases where the plasma easily concentrates at the edge part vicinity (the ceramic layer 20 on the edge part). Conversely, according to the embodiment, the angle θα between the first surface 11 and the oblique surface 13ac is greater than the angle θβ between the oblique surface 13ac and the perpendicular surface (the second hole part 13b). By setting the angle θα to be relatively large, the plasma concentration at the edge part vicinity formed by the first surface 11 and the oblique surface 13ac can be relaxed, and the production of particles can be suppressed. On the other hand, when the angle θβ is large, the plasma more easily penetrates the interior of the hole 13. Conversely, by setting the angle θβ to be relatively small, the penetration of the plasma into the interior of the hole 13 can be effectively suppressed.

The length in the Z-direction of the second hole part 13b is easily increased by setting the angle θα to be greater than the angle θβ. For example, a length Ln shown in FIG. 6A described below is greater than the length Ln shown in FIG. 6B. Also, for example, in FIG. 2, the position of the boundary 17 can be moved downward and the length of the second hole part 13b in the Z-direction can be increased by increasing the angle θα while maintaining the straight-line shape of the oblique surface 13ac and without changing the thickness of the base material 10 (the Z-direction positions of the first and second surfaces 11 and 12) or the diameter of the hole 13 (the X-direction positions of the boundaries 14 and 17). For example, the flow (the directionality) of the raw material gas of the plasma flowing into the chamber through the hole 13 is regulated by the second hole part 13b; therefore, the flow of the raw material gas is easily stabilized by making the second hole part 13b long. Also, when a unit such as an injector or the like is fixed to the second hole part 13b, the unit is easily mounted and the exposure of the unit to the plasma can be suppressed by making the second hole part 13b long.

It is favorable for the boundary 14 and the boundary 17 to be beveled. The plasma concentration at the boundary 17 and/or the ceramic layer 20 on the boundary 14 can be more relaxed thereby.

The angle θα is, for example, not less than 150° and not more than 180°, and favorably not less than 160° and not more than 180°. The plasma concentration at the edge part vicinity formed by the first surface 11 and the oblique surface 13ac can be more relaxed thereby, and the production of particles can be further suppressed.

The angle θβ is, for example, greater than 90° and not more than 120°, and favorably greater than 90° and not more than 105°. The penetration of the plasma into the hole interior can be more effectively suppressed thereby.

For example, the density of the second part 22 is greater than the density of the first part 21. Also, for example, the hardness of the second part 22 is greater than the hardness of the first part 21.

In the maintenance and/or handling of the semiconductor manufacturing apparatus member, there are cases where the vicinity of the hole 13 (and a through-hole 313 described below) physically contact another member (e.g., a sponge cleaning pad, a jig such as a pin, etc.). There is a risk that wear, damage, or delamination may occur at the vicinity of the hole 13 (and the through-hole 313) due to such physical contact, and particles may be produced. For example, when handling the semiconductor manufacturing apparatus member, there are cases where a jig such as a positioning pin or the like is inserted into the hole 13. Compared to the first part 21, the likelihood of such a jig physically contacting the second part 22 located in the hole 13 is high. Also, for example, during maintenance of the semiconductor manufacturing apparatus member, there are cases where surface cleaning of the first surface 11 side is performed, and a member such as a cleaning pad or the like contacts the first and second parts 21 and 22. At this time, there are cases where the force that is applied from the cleaning pad to the second part 22 located in the hole 13 is greater than the force applied from the cleaning pad to the first part 21 on the first surface 11 due to the shape of the hole 13. Generally, the contact area between the cleaning pad and the semiconductor manufacturing apparatus member is smaller at the second part 22 positioned at the oblique surface than at the first part 21 positioned at the planar part. Accordingly, when a constant force is applied to the cleaning pad, the force per unit area on the second part 22 is greater by the amount that the contact area is smaller.

Conversely, by setting the density of the second part 22 to be relatively high, the damage and/or delamination of the second part 22 due to physical contact in the maintenance or handling of the semiconductor manufacturing apparatus member can be suppressed. Accordingly, the production of particles can be further suppressed. Also, by setting the hardness of the second part 22 to be relatively high, the damage and/or the delamination of the second part 22 due to physical contact in the maintenance or handling of the semiconductor manufacturing apparatus member can be suppressed. Accordingly, the production of particles can be further suppressed.

Figure 3A:
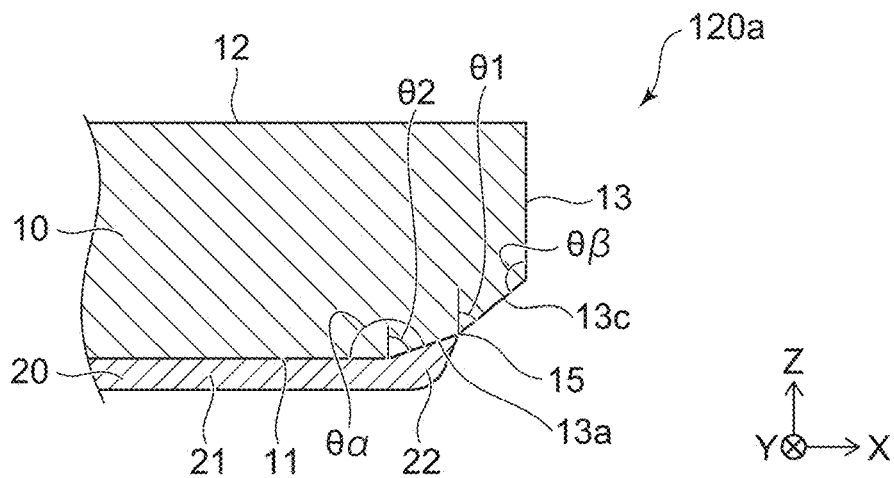
FIGS. 3A to 3C are cross-sectional views illustrating portions of other semiconductor manufacturing apparatus members according to the first embodiment.
Figure 3B:
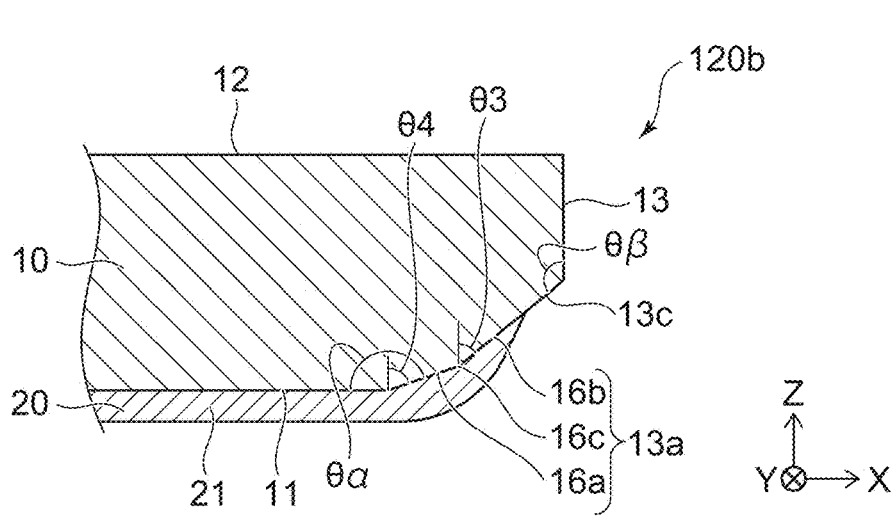
Figure 3C:
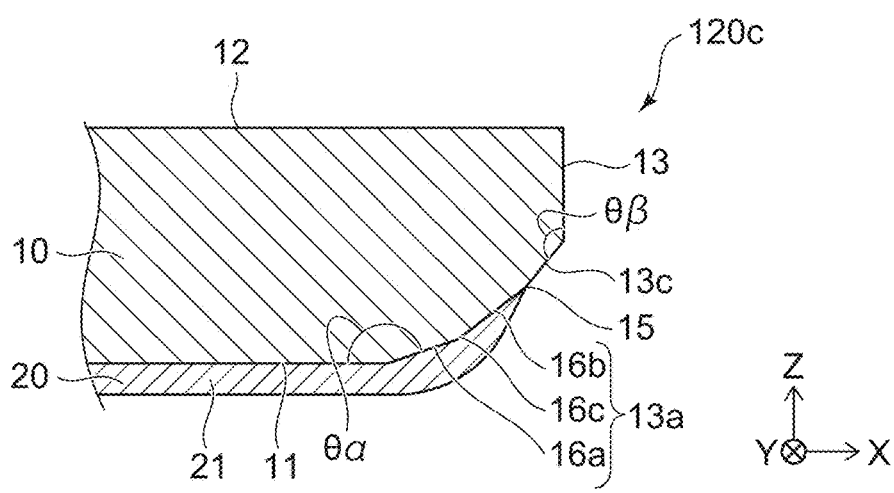

FIGS. 3A to 3C are cross-sectional views illustrating portions of other semiconductor manufacturing apparatus members according to the first embodiment.

The shapes of the holes 13 of the semiconductor manufacturing apparatus members 120a to 120c illustrated in FIGS. 3A to 3C are different from that of the semiconductor manufacturing apparatus member 120 described with reference to FIGS. 1 and 2. Otherwise, the semiconductor manufacturing apparatus members 120a to 120c are similar to the semiconductor manufacturing apparatus member 120.

In the semiconductor manufacturing apparatus member 120a illustrated in FIG. 3A, the first hole part 13a and the third hole part 13c each have straight-line shapes in the cross section parallel to the Z-direction. In FIG. 3A, in the cross section parallel to the Z-direction, the direction in which the first hole part 13a extends and the direction in which the third hole part 13c extends are not on the same straight line and are non-parallel. For example, the angle θ1 between the third hole part 13c and the Z-direction is less than the angle θ2 between the first hole part 13a and the Z-direction.

In the semiconductor manufacturing apparatus member 120a, a boundary 15 at which the first hole part 13a and the third hole part 13c contact is a corner in the cross section parallel to the Z-direction. However, the boundary 15 in the cross section of FIG. 3A may be rounded or curved, and may have a curvature.

In the semiconductor manufacturing apparatus member 120b illustrated in FIG. 3B, in the cross section parallel to the Z-direction, the third hole part 13c has a straight-line shape, and the first hole part 13a is bent. For example, the first hole part 13a includes a first region 16a contacting the first surface 11, and a second region 16b contacting the third hole part 13c. In the cross section of FIG. 3B, the first region 16a and the second region 16b each have straight-line shapes. The first region 16a and the second region 16b may be curved.

In the example of FIG. 3B, the direction in which the first region 16a extends and the direction in which the second region 16b extends are not on the same straight line and are non-parallel. For example, an angle θ3 between the second region 16b and the Z-direction is less than an angle θ4 between the first region 16a and the Z-direction. In the example of FIG. 3B, the direction in which the second region 16b extends and the direction in which the third hole part 13c extends are on the same straight line.

In the semiconductor manufacturing apparatus member 120b, a boundary 16c at which the first region 16a and the second region 16b contact is a corner in the cross section parallel to the Z-direction. However, the boundary 16c in the cross section of FIG. 3B may be rounded or curved, and may have a curvature.

In the semiconductor manufacturing apparatus member 120c illustrated in FIG. 3C, the first hole part 13a includes the first region 16a and the second region 16b; and the boundary 16c is a corner. The boundary 15 between the first hole part 13a and the third hole part 13c also is a corner. The boundary 15 and the boundary 16c may be rounded or curved, and may have curvatures. As described above, the cross-sectional shape of the hole 13 may be bent or curved as appropriate.

To evaluate the arithmetical mean height Sa, the arithmetical mean height Sa of the surface (the arithmetical mean height of the surface) of the evaluation object is measured using a laser microscope. The arithmetical mean height Sa is specified in international standard ISO 025178 (JIS B 0681) related to three-dimensional surface characteristics.

"VK-X1000/KEYENCE" is used as the laser microscope. The magnification of the objective lens is set to 1000 times. The S-filter is set to 2.5 µm or 0.8 µm, and the L-filter is set to 0.5 mm.

The arithmetical mean height is the three-dimensional expansion of the two-dimensional arithmetic average roughness Ra, and is a three-dimensional roughness parameter (a three-dimensional height direction parameter). Specifically, the arithmetical mean height Sa is the volume of the part surrounded with the surface configuration curved surface and the mean plane divided by the measurement area. The arithmetical mean height Sa is defined by the following formula, in which the mean plane is the xy plane, the vertical direction is the z-axis, and the measured surface configuration curve is z(x, y). Here, "A" in Formula (1) is the measurement area.

[Formula 1]

$$Sa = \frac{1}{A} \int\int_A |z(x, y)| dx dy \quad \text{Formula (1)}$$

The density of the ceramic layer 20 indicates the magnitude of the gap (nanolevel) between the grains included in the film. The density of the ceramic layer 20 (the densities of the first part 21, the second part 22, a third part 23 described below, etc.) can be evaluated using, for example, a luminance Sa calculated by a method recited in Japanese Patent No. 6597922. According to the embodiment, a high density corresponds to a low luminance Sa.

According to the embodiment, the surface hardnesses of the ceramic layer 20 and the base material 10 (the hardnesses of the first part 21, the second part 22, a first hole region 313a described below, a third hole region 313c described below, etc.) can be evaluated using the method specified in ISO 14577. Specifically, the hardness measurement is performed using an ultra-micro indentation hardness test (nanoindentation) of the surface of the evaluation object. The indenter is a Berkovich indenter; the indentation depth is the fixed value of 200 nm; and the indentation hardness HIT is measured. A surface without scratches or dents is selected as the HIT measurement location of the surface of the evaluation object. More favorably, the surface of the evaluation object is a polished smooth surface. At least 25 measurement points are used. The HIT average value of the at least 25 measurement points is used as the hardness according to the embodiment. Other test methods, analysis methods, procedures for verifying the performance of testers, and conditions necessary for standard reference samples conform to ISO 14577.

According to the embodiment, a high plasma corrosion resistance corresponds to a small arithmetical mean height Sa of the surface after a reference plasma resistance test. For example, the reference plasma resistance test is performed as follows. Plasma is irradiated on the surface of the evaluation object such as the ceramic layer, the base material, etc. An inductively coupled plasma reactive ion etching apparatus (Muc-21 Rv-Aps-Se/Sumitomo Precision Products Co., Ltd.) is used as the plasma etching apparatus. The conditions of the plasma etching are set to an ICP output of 1500 W and a bias output of 750 W as the power supply output, a gas mixture of 100 ccm of $CHF_3$ gas and 10 ccm of $O_2$ gas as the process gas, a pressure of 0.5 Pa, and a plasma etching time of 1 hour. The state of the surface of the evaluation object after plasma irradiation is imaged using a laser microscope. Specifically, the laser microscope "OLS4500/Olympus Corporation" is used, and an objective lens of the MPLAPON100xLEXT (a numerical aperture of 0.95, a working distance of 0.35 mm, a focus spot diameter of 0.52 µm, and a measurement region 128×128 µm) is used, and the magnification is set to 100 times. The λc filter of the waviness component removal is set to 25 µm. The measurement is performed at any three locations; and the average value is used as the arithmetical mean height Sa. Otherwise, the three-dimensional surface characteristics international standard ISO 25178 is referred to as appropriate. As one aspect of the invention, it is favorable for the arithmetical mean height Sa of the surface of the ceramic layer or the base material after the "reference plasma resistance test" to be not more than 0.060, and more favorably not more than 0.030.

A method for calculating the angle θα and the angle θβ of this specification will now be described with reference to FIGS. 4A to 4C.

Figure 4A:
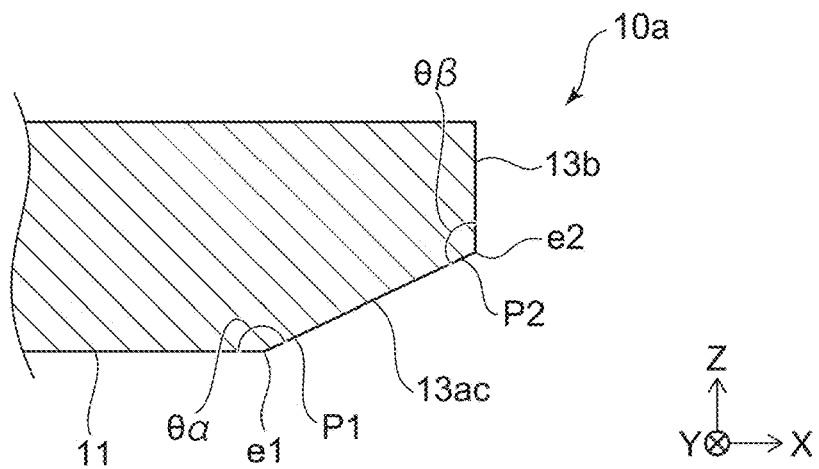
FIGS. 4A to 4C are cross-sectional views illustrating portions of base materials according to the first embodiment.
Figure 4B:
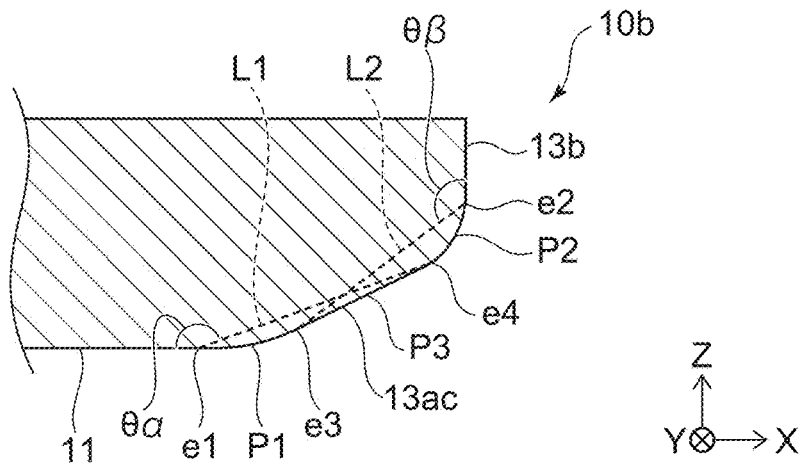
Figure 4C:
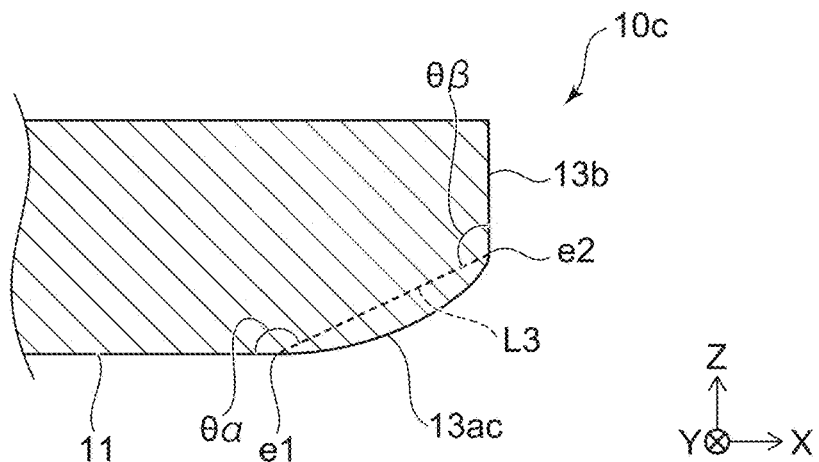

FIGS. 4A to 4C are cross-sectional views illustrating portions of base materials according to the first embodiment.

A base material 10a shown in FIG. 4A is similar to the base material 10 described with reference to FIG. 2. The first surface 11 extends along the X-Y plane. The second hole part 13b extends along the Z-direction. In the example, the oblique surface 13ac that connects the first surface 11 and the second hole part 13b has a straight-line shape in the cross section parallel to the Z-direction. In the cross section parallel to the Z-direction, the oblique surface 13ac extends in a straight-line shape from an edge e1 of the first surface 11 to an edge e2 of the second hole part 13b. The edge e1 is the point at which the first surface 11 contacts the oblique surface 13ac; and the edge e2 is the point at which the second hole part 13b contacts the oblique surface 13ac.

When a part P1 of the oblique surface 13ac that is continuous with the first surface 11 has a straight-line shape in the cross section parallel to the Z-direction, the angle θα is the angle between the first surface 11 and the part P1. When a part P2 of the oblique surface 13ac that is continuous with the second hole part 13b has a straight-line shape in the cross section parallel to the Z-direction, the angle θβ is the angle between the second hole part 13b and the part P2. In the example of FIG. 4A, the angle θα is formed by the first surface 11 and a line segment connecting the edge e1 and the edge e2; and the angle θβ is formed by the second hole part 13b and the line segment connecting the edge e1 and the edge e2. The angle θα and the angle θβ are interior angles of the base material 10 and are not more than 180°.

As shown in FIGS. 4B and 4C, when the parts P1 and P2 are curved in the cross section parallel to the Z-direction, the angle θα and the angle θβ are calculated as follows.

The shape of the oblique surface 13ac of a base material 10b shown in FIG. 4B is different from that of the base material 10a. In the base material 10b, in the cross section parallel to the Z-direction, the part P1 of the oblique surface 13ac that is continuous with the first surface 11 has a curved shape; and the part of the oblique surface 13ac that is continuous with the part P1 has a straight-line shape. In such a case, as shown in FIG. 4B, the angle θα is formed by the first surface 11 and a line segment L1. The line segment L1 connects the edge e1 and an edge e4; and the edge e4 is the end point of the straight-line part of the oblique surface 13ac that is continuous with the part P1. In the base material 10b, in the cross section parallel to the Z-direction, the part P2 of the oblique surface 13ac that is continuous with the second hole part 13b has a curved shape; and the part of the oblique surface 13ac that is continuous with the part P2 has a straight-line shape. In such a case, as shown in FIG. 4B, the angle θβ is formed by the second hole part 13b and a line segment L2. The line segment L2 connects the edge e2 and an edge e3; and the edge e3 is the end point of the straight-line part of the oblique surface 13ac that is continuous with the part P2. In the example, the part of the oblique surface 13ac between the part P1 and the part P2 is a straight-line part P3; the edge e3 of the part P3 is the point at which the part P3 contacts the part P1; and the edge e4 of the part P3 is the point at which the part P3 contacts the part P2.

The shape of the oblique surface 13ac of a base material 10c shown in FIG. 4C is different from that of the base material 10a. In the base material 10c, the oblique surface 13ac is a curve in the cross section parallel to the Z-direction. In such a case, as shown in FIG. 4C, the angle θα is formed by the first surface 11 and a line segment L3 connecting the edge e1 and the edge e2. Also, in such a case, as shown in FIG. 4C, the angle θβ is formed by the second hole part 13b and the line segment L3.

The base material 10 may be one of a metal, a ceramic, glass, a plastic, or a combination of such materials. It is favorable for the base material 10 to be a metal or a ceramic. The metal can include aluminum or an aluminum alloy having anodic oxidation (alumite treatment) performed on the surface. The ceramic can include aluminum oxide (alumina), aluminum nitride, etc.

The ceramic layer 20 includes, for example, a polycrystalline ceramic. The ceramic layer 20 is the layer having a ceramic as a major component. The ceramic layer 20 includes, for example, at least one selected from the group consisting of an oxide of a rare-earth element, a fluoride of a rare-earth element, and an acid fluoride of a rare-earth element. For example, at least one selected from the group consisting of Y, Sc, Yb, Ce, Pr, Eu, La, Nd, Pm, Sm, Gd, Tb, Dy, Ho, Er, Tm, and Lu are examples of the rare-earth element. More specifically, the ceramic layer 20 includes at least one selected from the group consisting of an oxide of yttrium ($Y_2O_3$ and $Y_\alpha O_\beta$ (nonstoichiometric composition)), an yttrium oxyfluoride (YOF, $Y_5O_4F_7$, $Y_6O_5F_8$, $Y_7O_6F_9$, and $Y_{17}O_{14}F_{23}$), $(YO_{0.826}F_{0.17})F_{1.174}$, $YF_3$, $Er_2O_3$, $Gd_2O_3$, $Nd_2O_3$, $Y_3Al_5O_{12}$, $Y_4Al_2O_9$, $Y_2O_3$—$ZrO_2$, $Er_3Al_5O_{12}$, $Gd_3Al_5O_{12}$, $Er_4Al_2O_9$, $ErAlO_3$, $Gd_4Al_2O_9$, $GdAlO_3$, $Nd_3Al_5O_{12}$, $Nd_4Al_2O_9$, and $NdAlO_3$. The ceramic layer 20 may include at least one selected from the group consisting of Fe, Cr, Zn, and Cu.

For example, the ceramic layer 20 includes yttrium and at least one of fluorine or oxygen. The ceramic layer 20 includes, for example, yttrium oxide ($Y_2O_3$), yttrium fluoride ($YF_3$), or yttrium oxyfluoride (YOF) as a major component.

In the specification, "major component" refers to the inclusion of more than 50% of the component, and favorably not less than 70%, more favorably not less than 90%, more favorably not less than 95%, and most favorably 100%. Here, "%" is, for example, the mass %.

Or, the ceramic layer 20 may be a compound other than an oxide, a fluoride, and an oxyfluoride. Specifically, a compound (a chloride and a bromide) including Cl and/or Br are examples.

In the semiconductor manufacturing apparatus member 120, the ceramic layer 20 may include only a polycrystalline ceramic, and may include a polycrystalline ceramic and an amorphous ceramic.

The average crystallite size of the polycrystalline ceramic of the ceramic layer 20 is not less than 3 nm and not more than 50 nm. The upper limit is favorably 30 nm, more favorably 20 nm, and more favorably 15 nm. A favorable lower limit is 5 nm.

The "average crystallite size" can be determined using the following method.

First, a transmission electron microscope (TEM) image is imaged using not less than a magnification of 400,000 times. The average value of the diameters of fifteen crystallites calculated using a circle approximation in the image is used as the average crystallite size. At this time, the crystallite can be discriminated more clearly by setting the sample thickness in the FIB processing to be sufficiently thin, e.g., about 30 nm. For example, the imaging magnification can be selected as appropriate in the range of not less than 400,000 times and not more than 2,000,000 times.

In the manufacturing procedure of the semiconductor manufacturing apparatus member according to the embodiment, first, the base material 10 in which the hole 13 is provided is prepared. Then, the shape of the base material 10 is prepared by an appropriate technique. For example, at least one of blasting, physical polishing, chemical mechanical polishing, lapping, or chemical polishing is performed on the base material 10. The arithmetical mean height Sa (the surface roughness) and the shapes of the first surface 11 and the hole 13 (the first hole part 13a, the second hole part 13b, and the third hole part 13c) can be controlled thereby.

Subsequently, the ceramic layer 20 is formed on the base material 10. Finishing polishing is performed after the ceramic layer 20 is formed. The polishing can include at least one of blasting, physical polishing, chemical mechanical polishing, lapping, or chemical polishing. For example, the arithmetical mean height Sa and the shape of the ceramic layer 20 (the surface 21s of the first part 21 and the surface 22s of the second part 22), the second hole part 13b, and the third hole part 13c can be controlled thereby.

The method of forming the ceramic layer 20 on the base material 10 can include, for example, a method such as thermal spraying, CVD, ALD (Atomic Layer Deposition), PVD (Physical Vapor Deposition), aerosol deposition, etc.

When the ceramic layer 20 is formed on the base material 10, for example, the film that becomes the ceramic layer 20 may be formed by providing a mask of tape, etc., on the part that becomes the third hole part 13c when using aerosol deposition, thermal spraying, CVD, or PVD. The second hole part 13b and the third hole part 13c that are exposed where the ceramic layer 20 is not located are formed by removing the mask after the film formation. Or, the second hole part 13b and the third hole part 13c that are exposed may be formed by removing a portion of a film by using polishing, etc., after the film formation without using a mask.

According to the method for forming the ceramic layer 20, there are cases where the ceramic layer 20 is not easily formed on the third hole part 13c that is the inner perimeter surface 13s of the hole 13 compared to the first surface 11. In other words, for example, when using a method of forming the ceramic layer by supplying (e.g., causing collisions of) raw material particles to the base material 10 from the first surface 11 side by using PVD, thermal spraying, aerosol deposition, etc., the third hole part 13c is separated from the first surface 11 and oblique to the first surface 11; and there are cases where the raw material particles reach the third hole part 13c in a different state from the plane because it is difficult for the raw material particles to reach the third hole part 13c, etc. In such a case, if the ceramic layer 20 is formed on the third hole part 13c, the quality (e.g., the density, the hardness, etc.) of the ceramic layer 20 formed on the third hole part 13c may be lower than the quality of the ceramic layer 20 formed on the first surface 11. There is a risk that portions of the low-quality fragile ceramic layer 20 may easily detach from the base material and become a production source of particles. Instead, the production of particles can be reduced by not providing the ceramic layer 20 at the third hole part 13c.

As in the third hole part 13c, there are cases where it is difficult to form the ceramic layer at the inner wall (the perpendicular surface) of the hole 13. When the ceramic layer is located inside the hole 13, there are cases where characteristics (e.g., the density and the film thickness) of the ceramic layer inside the hole 13 degrade compared to the characteristics of the ceramic layer located on the first surface of the base material. Particles are produced when a fragile ceramic layer inside the hole 13 is corroded by the plasma. For example, the mechanical properties (e.g., the toughness, the hardness, the strength with respect to an external force, etc.) of the ceramic layer having degraded characteristics are inferior to the mechanical properties of the base material. Therefore, there is a risk that particles may be produced due to physical impact and/or contact in the handling and/or maintenance of the semiconductor manufacturing apparatus member.

For example, when forming the ceramic layer 20 by PVD, thermal spraying, aerosol deposition, etc., the film is not easily formed on the perpendicular second hole part 13b; therefore, the film formation on the hole interior can be suppressed by making the second hole part 13b long.

In aerosol deposition, a layer structural component is formed by causing the fine particles of the material to collide with the base material and by bonding the fine particles on the base material by the impact of the collisions. On the other hand, in aerosol deposition, when the surface of the base material on which the fine particles of the material collide is rough, the fine particles do not easily bond/integrate on the base material; and the layer structural component is difficult to form. According to the embodiment, by setting the arithmetical mean height Sa of the third hole part 13c to be relatively large, the formation of a fragile ceramic layer on the third hole part 13c by aerosol deposition can be more reliably suppressed. Accordingly, the production of particles can be suppressed.

Thus, when using aerosol deposition, for example, the formation of the ceramic layer on the third hole part 13c can be suppressed by controlling the arithmetical mean height Sa of the third hole part 13c. When using aerosol deposition, the semiconductor manufacturing apparatus member is easily manufactured because processes of masking before film formation, etc., may be omitted.

"Aerosol deposition" is a method of spraying an "aerosol" including fine particles including a brittle material dispersed in a gas from a nozzle toward a base material such as metal, glass, a ceramic, a plastic, etc., causing the fine particles to collide with the base material, causing the brittle material fine particles to deform and fragment due to the impact of the collisions, and causing the fine particles to bond to directly form a layer structural component (also called a film structural component) made of the constituent materials of the fine particles on the base material.

In the example, for example, an aerosol that is a mixture of a gas and fine particles of a ceramic material such as yttria or the like having excellent particle resistance is sprayed toward the base material 10 to form the layer structural component (the ceramic layer 20).

According to aerosol deposition, a heating unit, a cooling unit, or the like is not particularly necessary; it is possible to form the layer structural component at room temperature; and a layer structural component that has a mechanical strength equal to or greater than that of a sintered body can be obtained. Also, it is possible to diversely change the density, the fine structure, the mechanical strength, the electrical characteristics, etc., of the layer structural component by controlling the shape and the composition of the fine particles, the conditions causing the fine particles to collide, etc.

In this specification, "polycrystal" refers to a structure body in which crystal grains are bonded/integrated. A crystal substantially includes one crystal grain. Normally, the diameter of the crystal grain is not less than 5 nanometers (nm). However, the crystal grains are a polycrystal when fine particles are assimilated into the structural component without fragmenting.

In this specification, when the primary particle is a dense particle, "fine particle" refers to an average particle size that is not more than 5 micrometers (μm) when identified by a particle size distribution measurement, a scanning electron microscope, etc. When the primary particle is a porous particle easily fragmented by impacting, "fine particle" refers to an average particle size that is not more than 50 μm.

In this specification, "aerosol" refers to a solid-gas mixed phase substance in which the fine particles described above are dispersed in a gas such as helium nitrogen, argon, oxygen, dry air, a gas mixture including such elements, etc.; and although there are also cases where an "agglomerate" is partially included, "aerosol" refers to the state in which the fine particles are dispersed substantially independently. Although the gas pressure and the temperature of the aerosol are arbitrary when forming the layer structural component, it is desirable for the concentration of the fine particles in the gas at the timing when sprayed from the dispensing aperture to be within the range of 0.0003 mL/L to 5 mL/L when the gas pressure is converted to 1 atmosphere and the temperature is converted to 20 degrees Celsius.

One feature of the process of aerosol deposition is that the process normally is performed at room temperature, and the formation of the layer structural component is possible at a temperature that is sufficiently less than the melting point of the fine particle material, that is, not more than several hundred degrees Celsius.

In this specification, "room temperature" refers to a temperature that is markedly less than the sintering temperature of a ceramic, and refers to an environment of substantially 0 to 100° C.; and a room temperature of about 20° C.±10° C. is most general.

For fine particles included in the powder body used as the raw material of the layer structural component, a brittle material such as a ceramic, a semiconductor, etc., can be used as a major body, and fine particles of the same material can be used independently or fine particles having different particle sizes can be mixed; and it is possible to mix, combine, and use different types of brittle material fine particles. It is also possible to use fine particles of a metal material, an organic material, etc., by mixing the fine particles of the metal material, the organic material, etc., with the brittle material fine particles and coating the fine particles of the metal material, the organic material, etc., onto the surfaces of the brittle material fine particles. Even in such cases, the brittle material is the major part of the formation of the layer structural component.

For the composite structure formed by such techniques, when crystalline brittle material fine particles are used as the raw material, the part of the layer structural component of the composite structure is a polycrystal having a small crystal grain size compared to the raw material fine particles; and there are many cases where the crystals of the polycrystal have substantially no crystal orientation. Also, a grain boundary layer that is made of a glass layer substantially does not exist at the interface between the brittle material crystals. Also, in many cases, the layer structural component part of the composite structure forms an "anchor layer" that sticks into the surface of the base material (in the example, the base material 10). The layer structural component, in which anchor layer is formed, is formed and adhered securely to the base material with exceedingly high strength.

A layer structural component that is formed by aerosol deposition possesses sufficient strength and is clearly different from a so-called "powder compact" having a state in which the fine particles are packed together by pressure and the form is maintained by physical adhesion.

For aerosol deposition, it can be confirmed that fragmentation/deformation occurs for the brittle material fine particles flying onto the base material by using X-ray diffraction, etc., to measure the size of the brittle material fine particles used as the raw material and the crystallite (crystal grain) size of the brittle material structural component that is formed. In other words, the crystallite size of the layer structural component formed by aerosol deposition is less than the crystallite size of the raw material fine particles. "Nascent surfaces" are formed at the "shear surfaces" and/or the "fracture surfaces" formed by the fine particles fragmenting and/or deforming; and the "nascent surfaces" are in the state in which atoms that existed in the interior of the fine particle and were bonded to other atoms are exposed. It is considered that the layer structural component is formed by the nascent surfaces, which are active and have high surface energy, being bonded to surfaces of adjacent brittle material fine particles, bonded to nascent surfaces of brittle materials, or bonded to the surface of the base material.

When an appropriate amount of hydroxide groups exists at the surfaces of the fine particles in the aerosol, it also may be considered that the bonding occurs due to mechanochemical acid-base dehydration reactions occurring due to local shear stress, etc., between the fine particles or between the structural component and the fine particles when the fine particles collide. It is considered that applying a continuous mechanical impact force from the outside causes these phenomena to continuously occur; the progression and densification of the bonds occur due to the repetition of the deformation, the fragmentation, etc., of the fine particles; and the layer structural component that is made of the brittle material grows.

For example, when the ceramic layer 20 is formed by aerosol deposition, compared to a ceramic sintered body, a spray coat, etc., the ceramic layer 20 has a dense fine structure and a small crystallite size. Thereby, the particle resistance of the semiconductor manufacturing apparatus member 120 according to the embodiment is greater than the particle resistance of a sintered body or a spray coat. Also, the probability of the semiconductor manufacturing apparatus member 120 according to the embodiment being a production source of particles is less than the probability of a sintered body, a spray coat, etc., being a production source of particles.

An example of the semiconductor manufacturing apparatus member 120 according to the invention being manufactured by, for example, aerosol deposition and an apparatus used for the manufacturing will now be described. The apparatus that is used for the aerosol deposition includes a chamber, an aerosol supplier, a gas supplier, an exhaust part, and a pipe. For example, a stage at which the base material 10 is located, a driver, and a nozzle are located inside the chamber. The positions of the nozzle and the base material 10 located at the stage can be relatively changed by the driver. At this time, the distance between the nozzle and the base material 10 may be constant or may be changeable. Although an aspect in which the driver drives the stage is shown in the example, the driver may drive the nozzle. The drive directions are, for example, the XYZθ-directions.

The aerosol supplier is connected with the gas supplier by a pipe. In the aerosol supplier, an aerosol in which a gas and raw material fine particles are mixed is supplied to the nozzle via the pipe. The apparatus further includes a powder body supplier supplying the raw material fine particles. The powder body supplier may be located in the aerosol supplier or may be located separately from the aerosol supplier. An aerosol former that mixes the raw material fine particles and the gas also may be included separately from the aerosol supplier. A homogeneous structural component can be obtained by controlling the supply rate from the aerosol supplier so that the amount of the fine particles sprayed from the nozzle is constant.

The gas supplier supplies nitrogen gas, helium gas, argon gas, air, etc. Although compressed air in which, for example, impurities such as moisture, oil, etc., are low is used when the supplied gas is air, it is favorable also to include an air processor to remove the impurities from the air.

An example of the operation of the apparatus used for aerosol deposition will now be described. In the state in which the base material 10 is located on the stage inside the chamber, the chamber interior is depressurized to not more than atmospheric pressure, and specifically to about several hundred Pa by an exhaust part such as a vacuum pump, etc. On the other hand, the internal pressure of the aerosol supplier is set to be greater than the internal pressure of the chamber. The internal pressure of the aerosol supplier is, for example, several hundred to several tens of thousand Pa. The powder body supplier may be at atmospheric pressure. The fine particles in the aerosol is accelerated by the pressure difference between the chamber and the aerosol supplier, etc., so that the jet velocity of the raw material particles from the nozzle is in the range of subsonic speed to supersonic speed (50 to 500 m/s). The jet velocity is controlled by the gas type and the flow velocity of the gas supplied from the gas supplier, the shape of the nozzle, the length and/or the inner diameter of the pipe, the exhaust rate of the exhaust part, etc. For example, a supersonic nozzle such as a Laval nozzle, etc., also can be used as the nozzle. The fine particles in the aerosol are sprayed at a high speed from the nozzle, collide with the base material 10, are pulverized or deformed, and are deposited on the base material 10 as a structural component (the ceramic layer 20). By changing the relative positions of the base material and the nozzle, a composite structure (the semiconductor manufacturing apparatus member 120) that includes the structural component (the ceramic layer 20) having a prescribed surface area on the base material 10 is formed.

A pulverizer for pulverizing the agglomerate of fine particles before being sprayed from the nozzle may be included. Any method can be selected as the pulverizing method of the pulverizer. For example, known methods include mechanical pulverization such as vibrating, colliding, or the like, static electricity, plasma irradiation, classification, etc.

Second Embodiment

Figure 5A:
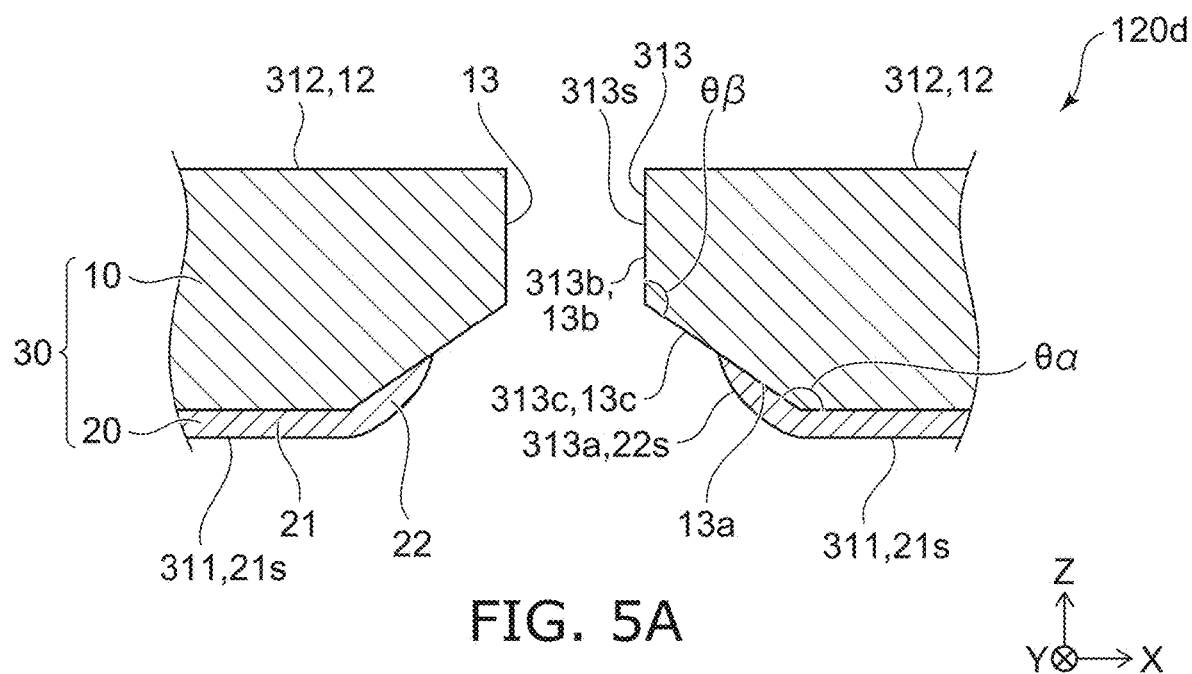
FIGS. 5A and 5B are cross-sectional views illustrating portions of semiconductor manufacturing apparatus members according to a second embodiment.
Figure 5B:
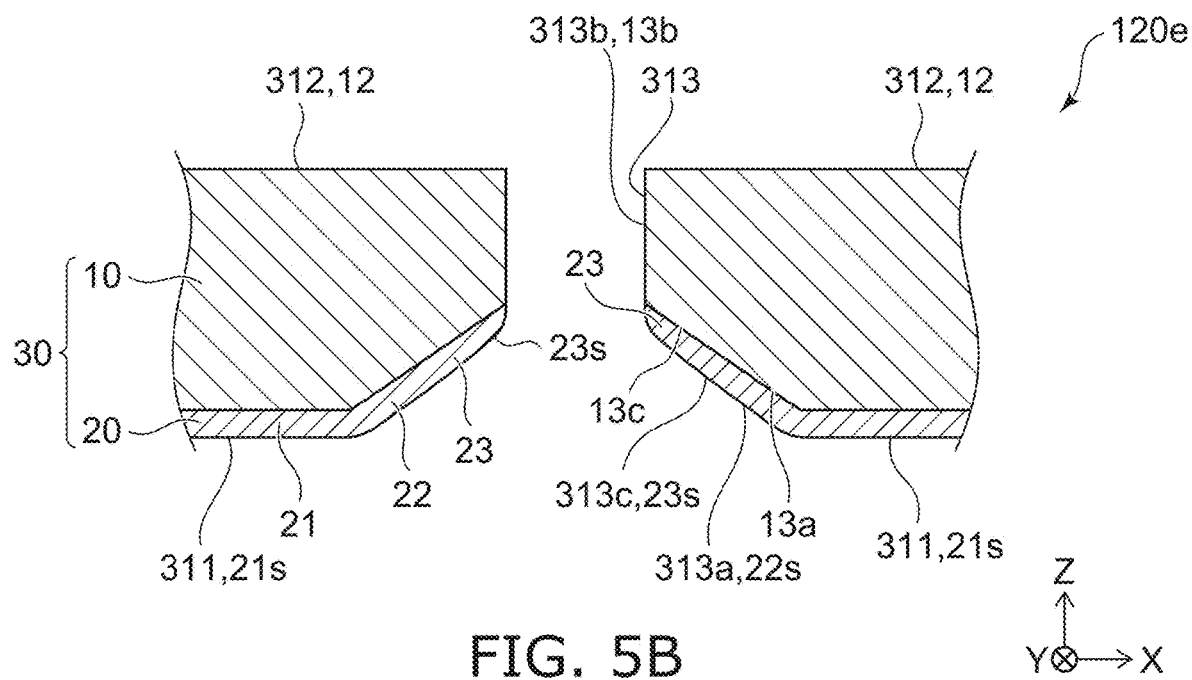

FIGS. 5A and 5B are cross-sectional views illustrating portions of semiconductor manufacturing apparatus members according to a second embodiment.

A description similar to that of the semiconductor manufacturing apparatus member 120 is applicable to a semiconductor manufacturing apparatus member 120d illustrated in FIG. 5A. However, the arithmetical mean height Sa of the surface of the first part 21 may not be less than the arithmetical mean height Sa of the surface of the second part 22, or may be similar to that of the semiconductor manufacturing apparatus member 120. Also, the arithmetical mean height Sa of the third hole part 13c may not be greater than the arithmetical mean heights Sa of the surfaces of the first and second parts 21 and 22, or may be similar to that of the semiconductor manufacturing apparatus member 120.

As illustrated in FIG. 5A, the semiconductor manufacturing apparatus member 120d includes a composite structure 30. The composite structure refers to a component that includes a base material and a structural component (e.g., a layer or a film) located on the base material surface. The composite structure 30 includes the base material 10 and the ceramic layer 20. In the example, the composite structure 30 is a stacked body of the base material 10 and the ceramic layer 20. According to the embodiment, the base material 10 and the ceramic layer 20 each may include a stacked structure that includes multiple layers.

As illustrated in FIG. 5A, the composite structure 30 includes a first major surface 311, and a second major surface 312 at the side opposite to the first major surface 311. For example, the first major surface 311 is the surface 21s of the first part of the ceramic layer 20; and the second major surface 312 is the second surface 12 of the base material 10. Also, at least one through-hole 313 is provided in the composite structure 30. The through-hole 313 extends in the Z-direction and extends through the base material 10 and the ceramic layer 20. For example, one through-hole 313 is located at the center of the composite structure 30. However, the through-hole 313 may not be at the center of the composite structure 30; and multiple through-holes 313 may be provided.

The through-hole 313 is, for example, circular when viewed along the Z-direction. The through-hole 313 (an inner perimeter surface 313s of the through-hole) includes the first hole region 313a, a second hole region 313b, and the third hole region 313c. The first hole region 313a, the second hole region 313b, and the third hole region 313c each are exposed and contact the plasma. The inner perimeter surface 313s is the inner perimeter surface of the composite structure 30 that defines the through-hole 313. The inner perimeter surface 313s faces the interior of the through-hole 313 and crosses the X-Y plane.

The first hole region 313a is a region of the inner perimeter surface 313s positioned at the vicinity of the first major surface 311 and next to the first major surface 311. The first hole region 313a is continuous with the first major surface 311. The first hole region 313a is positioned between the first major surface 311 and the second major surface 312 in the Z-direction. The first hole region 313a is an oblique surface that is not parallel to the first major surface 311 and crosses the first major surface 311 and the Z-direction. The first hole region 313a may be a surface that extends parallel to the Z-direction. In the cross section parallel to the Z-direction, the first hole region 313a may have a straight-line shape or may be curved. For example, the first hole region 313a has a ring shape surrounded with the first major surface 311 when viewed along the Z-direction (i.e., when projected onto the X-Y plane).

The second hole region 313b is positioned between the first hole region 313a and the second major surface 312 in the Z-direction. In other words, the Z-direction position of the second hole region 313b is between the Z-direction position of the first hole region 313a and the Z-direction position of the second major surface 312. For example, the second hole region 313b is a region of the inner perimeter surface 313s that is positioned at the vicinity of the second major surface 312 and is next to the second major surface 312. The second hole region 313b may be continuous with the second major surface 312. The second hole region 313b extends in the Z-direction and is, for example, parallel to the Z-direction. The second hole region 313b is, for example, a perpendicular surface that is substantially perpendicular to the second major surface 312. When viewed along the Z-direction, for example, the second hole region 313b has a ring shape inside the first hole region 313a.

The third hole region 313c is positioned between the first hole region 313a and the second hole region 313b in the Z-direction. In other words, the Z-direction position of the third hole region 313c is between the Z-direction position of the first hole region 313a and the Z-direction position of the second hole region 313b. The third hole region 313c is a region of the inner perimeter surface 313s that is continuous with the first hole region 313a. The third hole region 313c is an oblique surface that is not parallel to the first surface 11 and crosses the first surface 11 and the Z-direction. The third hole region 313c may be a surface that extends in the Z-direction. In the cross section parallel to the Z-direction, the third hole region 313c may have a straight-line shape or may be curved. When viewed along the Z-direction, for example, the third hole region 313c has a ring shape that is surrounded with the first hole region 313a and contacts the first hole region 313a; and the second hole region 313b is positioned inside the third hole region 313c. The third hole region 313c and the second hole region 313b may be continuous.

In the example of FIG. 5A, the first hole region 313a of the through-hole 313 is the surface 22s of the second part 22 of the ceramic layer 20; the second hole region 313b is the second hole part 13b of the hole 13 of the base material 10; and the third hole region 313c is the third hole part 13c of the hole 13 of the base material 10. A portion of the through-hole 313 of the composite structure 30 is at least a portion of the hole 13 of the base material 10. Specifically, a portion of the through-hole 313 is defined by the second and third hole parts 13b and 13c that define a portion of the hole 13 of the base material 10.

The hardness of the third hole region 313c is greater than the hardness of the first hole region 313a. For example, the third hole region 313c wears less easily than the first hole region 313a. In the example of FIG. 5A, the hardness of the third hole part 13c of the base material 10 is greater than the hardness of the surface 22s of the ceramic layer 20. For example, the hardness of the material of the base material 10 is greater than the hardness of the material of the ceramic layer 20. Thereby, the hardness of the third hole region 313c can be set to be greater than the hardness of the first hole region 313a. Specifically, the materials of the first and second parts 21 and 22 of the ceramic layer 20 can include at least one of an oxide of a rare-earth element, a fluoride of a rare-earth element, or an acid fluoride of a rare-earth element. The rare-earth element is at least one selected from the group consisting of Y, Sc, Yb, Ce, Pr, Eu, La, Nd, Pm, Sm, Gd, Tb, Dy, Ho, Er, Tm, and Lu. The material of the base material 10 can include at least one of aluminum oxide ($Al_2O_3$), zirconium oxide ($ZrO_2$), or aluminum nitride (AlN).

The third hole region 313c is positioned further inward of the through-hole 313 than the first hole region 313a. For example, when handling the semiconductor manufacturing apparatus member, when a jig such as a positioning pin or the like is inserted into the through-hole 313, the likelihood of the third hole region 313c physically contacting the jig is greater than the likelihood of the first hole region 313a physically contacting the jig. For example, during maintenance of the semiconductor manufacturing apparatus member, when the first hole region 313a and the third hole region 313c contact a cleaning pad, there is a risk that the third hole region 313c may wear more easily than the first hole region 313a if the angle θβ is less than the angle θα. For example, when the angle θβ is less than the angle θα, there is a risk that the force may concentrate more easily and wear may occur more easily at the vicinity of the corner at the boundary between the third hole region 313c and the second hole region 313b than at the vicinity of the corner at the boundary between the first hole region 313a and the first major surface 311.

Conversely, according to the embodiment, because the hardness of the third hole region 313c is relatively high, damage of the third hole region 313c due to physical contact in the maintenance or handling of the semiconductor manufacturing apparatus member can be suppressed. The production of particles can be suppressed thereby.

A semiconductor manufacturing apparatus member 120e illustrated in FIG. 5B differs from the semiconductor manufacturing apparatus member 120d in that the ceramic layer 20 includes the third part 23. In the semiconductor manufacturing apparatus member 120e, the third hole region 313c is a surface 23s of the third part 23. Otherwise, a description similar to that of the semiconductor manufacturing apparatus member 120d is applicable to the semiconductor manufacturing apparatus member 120e.

The third part 23 of the ceramic layer 20 is located on the third hole part 13c and contacts the third hole part 13c. The third part 23 is continuous with the second part 22. The surface 23s of the third part 23 directly contacts the plasma. That is, the surface 23s is at the side opposite to the surface of the third part 23 contacting the third hole part 13c and is exposed inside the chamber 110. In the example, the first hole part 13a and the third hole part 13c are covered with the ceramic layer 20 and do not directly contact the plasma. The production of particles from the first and third hole parts 13a and 13c of the hole 13 of the base material can be suppressed thereby. On the other hand, when the ceramic layer 20 is not located at the third hole part 13c as in the example of FIG. 5A, the formation of the ceramic layer 20 having degraded characteristics at the third hole part 13c can be suppressed, and the production of particles from the ceramic layer 20 can be further suppressed.

In the example of FIG. 5B, the first hole region 313a of the through-hole 313 is the surface 22s of the second part 22 of the ceramic layer 20; the second hole region 313b is the second hole part 13b of the hole 13 of the base material 10; and the third hole region 313c is the surface 23s of the third part 23 of the ceramic layer 20. In the example as well, a portion of the through-hole 313 of the composite structure 30 is at least a portion of the hole 13 of the base material 10. Specifically, a portion of the through-hole 313 is defined by the second hole part 13b that defines a portion of the hole 13 of the base material 10.

In the semiconductor manufacturing apparatus member 120e as well, the hardness of the third hole region 313c is greater than the hardness of the first hole region 313a. In other words, the hardness of the surface 23s of the third part 23 of the ceramic layer 20 is greater than the hardness of the surface 22s of the second part 22 of the ceramic layer 20. Damage of the third hole region 313c due to physical contact in the maintenance or handling of the semiconductor manufacturing apparatus member can be suppressed thereby. The production of particles can be suppressed thereby.

For example, the material of the third part 23 is different from the material of the second part 22; and the hardness of the material of the third part 23 is greater than the hardness of the material of the second part 22. Thereby, the hardness of the third hole region 313c can be set to be greater than the hardness of the first hole region 313a. For example, the material of the third part 23 can include at least one of an oxide of a rare-earth element, a fluoride of a rare-earth element, or an acid fluoride of a rare-earth element. The rare-earth element is at least one selected from the group consisting of Y, Sc, Yb, Ce, Pr, Eu, La, Nd, Pm, Sm, Gd, Tb, Dy, Ho, Er, Tm, and Lu. The hardness of the third part 23 and the hardness of the second part 22 can be set to be different by setting the composition of the third part 23 and the composition of the second part 22 to be different.

The film that is used to form the second part 22 and the film that is used to form the third part 23 each can be provided in the desired areas by using masking such as tape, etc. For example, the film that is used to form the third part 23 is formed on the third hole part 13c in a state in which a mask is provided on the first hole part 13a or the second part 22. For example, the film that is used to form the second part 22 is formed on the first hole part 13a in a state in which a mask is provided on the third hole part 13c or the third part 23. Thereby, separate films can be formed on the first and third hole parts 13a and 13c; and the material of the third part 23 and the material of the second part 22 can be different. Thereby, the hardness of the third part 23 and the hardness of the second part 22 can be different. Separate films may be provided on the first and third hole parts 13a and 13c by removing a portion of the film after film formation by polishing, etc., without using masking.

For example, the density of the third part 23 is greater than the density of the second part 22. Thereby, the hardness of the third hole region 313c can be set to be greater than the hardness of the first hole region 313a. For example, the second part 22 and the third part 23 can be formed by forming one film as the second and third parts 22 and 23 and by subsequently performing surface modification treatment of a portion of the film. Examples of the surface modification treatment include a method of forming a melt-solidification film by applying energy to melt a prescribed depth range from the surface of the film and by subsequently cooling the depth range. Compared to regions on which the surface modification treatment is not performed, the melt-solidification film that is formed by the surface modification treatment is a dense film having a planarized surface and few pores. A method that can selectively perform thermofusion of the surface may be used as the surface modification treatment. Specifically, laser annealing treatment or plasma jet treatment are examples of surface modification treatment. For example, the area on which the surface modification treatment is performed becomes the third part 23, and the area on which the surface modification treatment is not performed becomes the second part 22.

The film formation conditions of the third part 23 and the film formation conditions of the second part 22 may be different. Thereby, the density of the third part 23 and the density of the second part 22 can be different, or the hardness of the third part 23 and the hardness of the second part 22 can be different. When using aerosol deposition, the flow rate or flow velocity of the gas supplied from the gas supplier, the gas type, etc., are examples of the film formation conditions. The film formation condition may be the angle at which the aerosol sprayed from the nozzle collides with the base material.

According to the embodiment, the ceramic layer 20 may not always be located on the first and third hole parts 13a and 13c. The first hole region 313a may be the surface of the base material 10. The hardness of a portion of the base material surface may be adjusted as appropriate by surface treatment (e.g., a coating or modification treatment), etc.

Figure 6A:
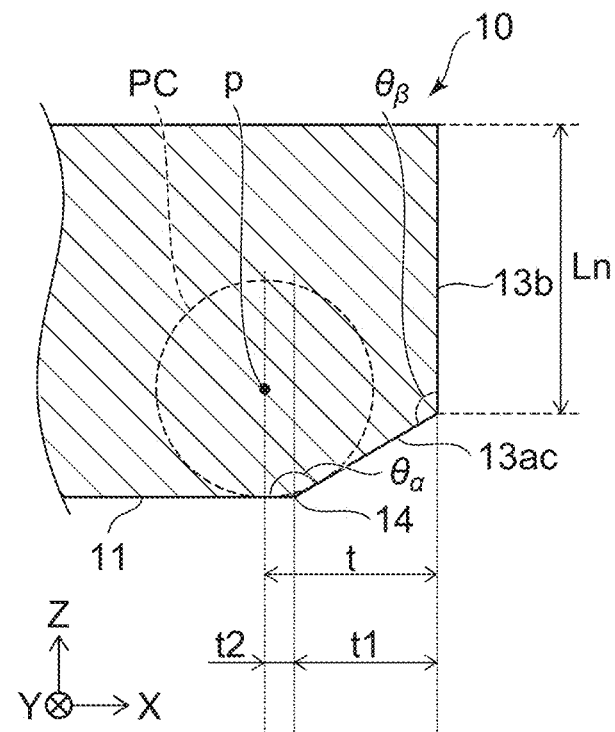
FIGS. 6A and 6B are cross-sectional views illustrating portions of semiconductor manufacturing apparatus members.
Figure 6B:
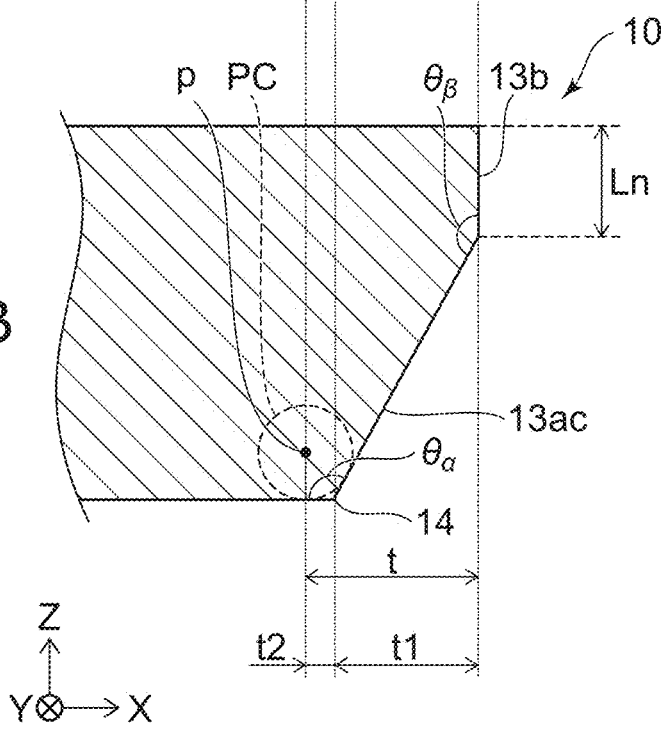

FIGS. 6A and 6B are cross-sectional views illustrating portions of semiconductor manufacturing apparatus members. FIGS. 6A and 6B each illustrate the base material 10 of the semiconductor manufacturing apparatus member. The configuration of the base material 10 shown in FIG. 6A is similar to the base material 10 described above in reference to FIG. 2. The angle $\theta\alpha$ of the base material 10 of FIG. 6A is 150°.

The angle $\theta\alpha$ of the base material 10 shown in FIG. 6B is 120°. The shape (the length and the angle) of the oblique surface 13ac and the length of the second hole part 13b in the base material 10 of FIG. 6B are different from those of the base material 10 of FIG. 6A. Otherwise, the configuration of the base material 10 of FIG. 6B is similar to that of the base material 10 of FIG. 6A.

In the base material 10 illustrated in FIG. 6A, the angle $\theta\alpha$ is greater than the angle $\theta\beta$. In the base material 10 illustrated in FIG. 6B, the angle $\theta\alpha$ is less than the angle $\theta\beta$. The length Ln in the Z-direction of the second hole part 13b of the base material 10 of FIG. 6A is greater than the length Ln in the Z-direction of the second hole part 13b of the base material 10 of FIG. 6B. Thus, when the thickness of the base material 10 is constant, the length in the Z-direction of the second hole part 13b is easily increased when the angle $\theta\alpha$ is greater than the angle $\theta\beta$.

Proximity circles PC are shown in FIGS. 6A and 6B. The proximity circles PC are proximate to the edge part (the boundary 14) formed of the first surface 11 and the oblique surface 13ac. In a cross section parallel to the Z-direction such as those of FIGS. 6A and 6B, the proximity circle PC is a circle that contacts the first surface 11 and the oblique surface 13ac. A distance (a distance t2) between the X-direction position of the center p of the proximity circle PC and the X-direction position of the boundary 14 in FIG. 6A and the distance (the distance t2) between the X-direction position of the center p of the proximity circle PC and the X-direction position of the boundary 14 in FIG. 6B match. That is, in FIGS. 6A and 6B, the X-direction positions of the centers p match when the X-direction positions of the boundaries 14 match. In such a case, a width t of the incline is constant in FIGS. 6A and 6B. In other words, the width t of FIG. 6A and the width t of FIG. 6B are equal to each other. When a radius R of the proximity circle PC shown in FIG. 6A is taken to be r, the radius R of the proximity circle PC shown in FIG. 6B is 0.47 r.

Here, the width t of the incline is the sum of the distance t2 and a prescribed distance t1. The prescribed distance t1 in FIG. 6A is the distance in the X-direction from the boundary 14 to the second hole part 13b. The prescribed distance t1 is constant. In other words, the prescribed distance t1 of FIG. 6A and the prescribed distance t1 of FIG. 6B are equal to each other. The width t of the incline is the distance along the X-direction between the center p of the proximity circle PC and the second hole part 13b of FIG. 6A.

Figure 7:
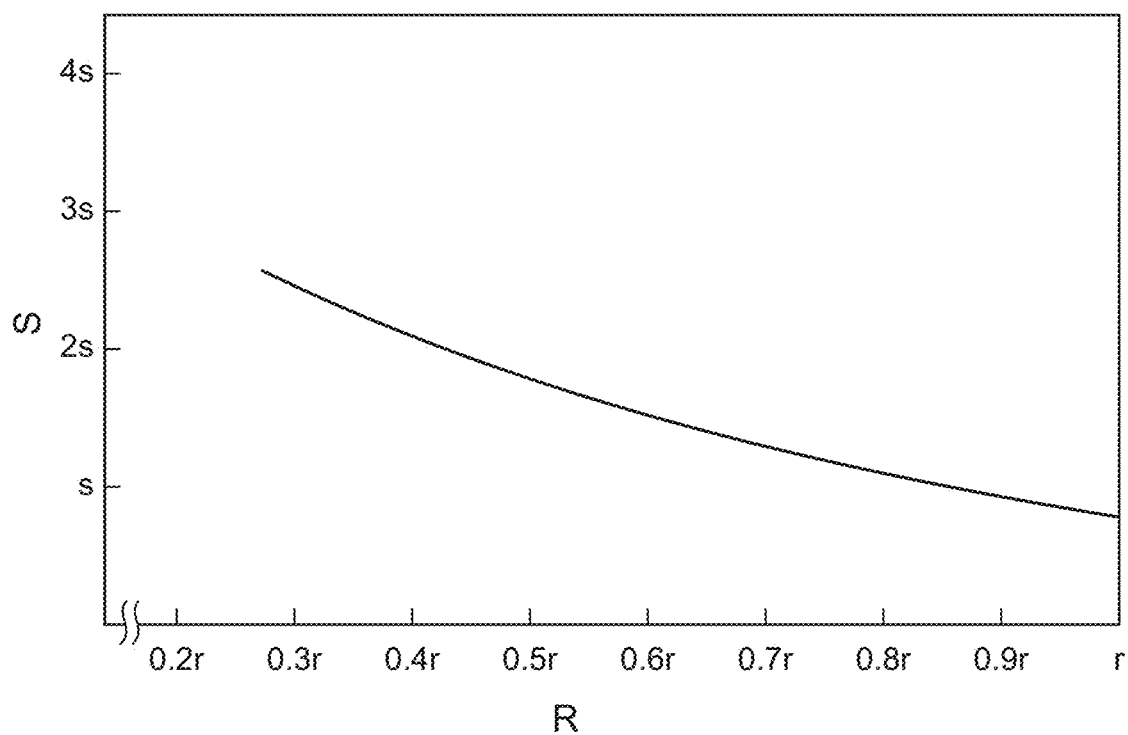
FIG. 7 is a graph illustrating stress of the semiconductor manufacturing apparatus member.

FIG. 7 is a graph illustrating stress of the semiconductor manufacturing apparatus member.

FIG. 7 illustrates a calculation result of the relationship between the radius R of the proximity circle PC and stress S generated in the semiconductor manufacturing apparatus member. Namely, FIG. 7 shows the change of the stress S of a semiconductor manufacturing apparatus member similar to that of FIG. 2 when the radius R of the proximity circle PC of the base material 10 is changed similarly to FIGS. 6A and 6B. More specifically, in the base material 10, the distance t2 (the distance between the X-direction position of the center p of the proximity circle PC and the X-direction position of the boundary 14) and the thickness of the base material 10 are kept constant, and the angle $\theta\alpha$ is changed. The stress S that is generated in the ceramic layer 20 formed on the boundary 14 when changing the radius R, the length in the Z-direction of the second hole part 13b, and the shape (the length and the angle) of the oblique surface 13ac are calculated thereby. The angle θα is taken to be greater than 90° which corresponds to radius R>0.27 r.

The stress S is the calculation result of the stress (e.g., the residual stress) generated in the connection part between the first part 21 and the second part 22 (i.e., the ceramic layer 20 formed on the boundary 14). For example, the magnitude of the stress S corresponds to the electric field intensity at the surface of the ceramic layer 20 on the boundary 14.

The radius R of the proximity circle PC increases as the angle θα increases. As illustrated in FIG. 7, the stress S decreases as the radius R increases. For example, the radius R when the angle θα is 150° as in FIG. 6A is taken as r; and the corresponding stress S is taken as about s. When the angle θα is 120° as in FIG. 6B, the radius R is 0.47 r, and the corresponding stress S is calculated to be about 1.7 s. In other words, compared to the example of FIG. 6B, the stress concentration can be suppressed and the stress can be reduced by about 1.7 times in the example of FIG. 6A. That is, the stress concentration can be relaxed by increasing the angle θα. The angle θα is, for example, not less than 150°, and more favorably not less than 160°.

For example, the oblique surface 13ac is taken to have a straight-line shape in the cross section parallel to the Z-direction. When the oblique surface 13ac is curved in the cross section parallel to the Z-direction, there are cases where the electric field concentrates in the oblique surface 13ac or the ceramic layer 20 on the oblique surface 13ac, and particles are produced. Conversely, when the oblique surface 13ac has a straight-line shape in the cross section parallel to the Z-direction, the electric field concentration at the oblique surface 13ac or the ceramic layer 20 on the oblique surface 13ac can be more relaxed.

For example, when the radius R is 0.3 r, the stress S is about 2.5 s; and when the radius R is 0.7 r, the stress S is about 1.2 s.

FIG. 8 is a table illustrating an evaluation of the particle resistance of the semiconductor manufacturing apparatus member. Samples 1 to 5 each were similar to the semiconductor manufacturing apparatus member 120 described with reference to FIG. 2. As illustrated in FIG. 8, at least one of the arithmetical mean height Sa of the first part 21, the arithmetical mean height Sa of the second part 22, or the arithmetical mean height Sa of the third hole part 13c was changed between the samples 1 to 5. The features other than the arithmetical mean height Sa (e.g., the angle θα, the angle θβ, the thickness of the base material 10, etc.) were constant in the samples 1 to 5.

In the sample 1, the arithmetical mean height Sa of the first part 21 was 0.03 μm, the arithmetical mean height Sa of the second part 22 was 0.06 μm, and the arithmetical mean height Sa of the third hole part 13c was 0.2 μm.

In the sample 2, the arithmetical mean height Sa of the first part 21 was 0.03 μm, the arithmetical mean height Sa of the second part 22 was 0.12 μm, and the arithmetical mean height Sa of the third hole part 13c was 0.5 μm.

In the sample 3, the arithmetical mean height Sa of the first part 21 was 0.06 μm, the arithmetical mean height Sa of the second part 22 was 0.35 μm, and the arithmetical mean height Sa of the third hole part 13c was 0.3 μm.

In the sample 4, the arithmetical mean height Sa of the first part 21 was 0.08 μm, the arithmetical mean height Sa of the second part 22 was 0.81 μm, and the arithmetical mean height Sa of the third hole part 13c was 0.85 μm.

In the sample 5, the arithmetical mean height Sa of the first part 21 was 0.15 μm, the arithmetical mean height Sa of the second part 22 was 0.41 μm, and the arithmetical mean height Sa of the third hole part 13c was 0.2 μm.

FIG. 8 also shows a ratio R21 and a ratio R31 for each sample. The ratio R21 is the ratio of the arithmetical mean height Sa of the second part 22 to the arithmetical mean height Sa of the first part 21. The ratio R31 is the ratio of the arithmetical mean height Sa of the third hole part 13c to the arithmetical mean height Sa of the first part 21.

FIG. 8 illustrates the particle resistance of each sample as "⊚", "◯", or "x". The particle resistance was evaluated by irradiating plasma on the samples and by evaluating the difference between the arithmetical mean height Sa before plasma irradiation and the arithmetical mean height Sa after plasma irradiation. The conditions of the plasma irradiation were as follows. An inductively coupled plasma reactive ion etching apparatus (Muc-21Rv-Aps-Se/Sumitomo Precision Products Co., Ltd.) was used as the plasma etching apparatus. The conditions of the plasma etching were ICP (Inductively Coupled Plasma) having an output of 1500 W and a bias output of 750 W as the power supply output, a gas mixture of 100 ccm of $CHF_3$ gas and 10 ccm of $O_2$ gas as the process gas, a pressure of 0.5 Pa, and a plasma etching time of 1 hour.

"⊚" indicates that the change of the arithmetical mean height Sa due to the plasma irradiation was small for all of the first part 21, the second part 22, and the third hole part 13c. "◯" indicates that the change of the arithmetical mean height Sa due to the plasma irradiation was small for at least two among the first part 21, the second part 22, or the third hole part 13c. "x" indicates a particle resistance other than "⊚" and "◯".

As described above, for example, the arithmetical mean height Sa of the surface 22s of the second part 22 is not less than 2 times and not more than 10 times the arithmetical mean height Sa of the surface 21s of the first part 21, and more favorably not more than 5 times. In other words, the ratio R21 is not less than 2.0 and not more than 10, and more favorably not more than 5.0. As illustrated in FIG. 8, the particle resistance of the sample 3 in which the ratio R21 was 5.8 was greater than the particle resistance of the sample 4 in which the ratio R21 was 10.1. The particle resistances of the sample 1 in which the ratio R21 was 2.0 and the sample 2 in which the ratio R21 was 4.0 were greater than the particle resistance of the sample 3.

Also, as described above, for example, the arithmetical mean height Sa of the third hole part 13c is greater than 2 times the arithmetical mean height Sa of the surface 21s of the first part 21. In other words, the ratio R31 is greater than 2.0. As illustrated in FIG. 8, the particle resistances of the sample 1 in which the ratio R31 was 6.7, the sample 2 in which the ratio R31 was 16.7, and the sample 3 in which the ratio R31 was 5.0 were greater than the particle resistance of the sample 5 in which the ratio R31 was 1.3.

The cross sections of the semiconductor manufacturing apparatus member described with reference to FIGS. 2 to 6B may be cross sections that pass through the center of the hole 13 in the X-Y plane.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described. However, the invention is not limited to these descriptions. Appropriate design modifications made by one skilled in the art for the embodiments described above also are within the scope of the invention to the extent that the features of the invention are included. For example, the configurations, the dimensions, the materials, the arrangements, the mounting forms, etc., of the components included in the semiconductor manufacturing apparatus member and the semiconductor manufacturing apparatus are not limited to those illustrated and can be modified appropriately. The components included in the embodiments described above can be combined within the limits of technical feasibility; and such combinations also are within the scope of the invention to the extent that the features of the invention are included.

What is claimed is:

1. A semiconductor manufacturing apparatus member used inside a chamber of a semiconductor manufacturing apparatus, the member comprising:
   a base material including
      a first surface,
      a second surface at a side opposite to the first surface, and
      at least one hole extending through the first and second surfaces; and
   a ceramic layer located on at least the first surface of the base material, the ceramic layer being exposed, the ceramic layer being plasma-resistant,
   the at least one hole including
      an oblique surface that is continuous with the first surface and is oblique to a first direction, the first direction being from the first surface toward the second surface, and
      a perpendicular surface that is positioned between the second surface and the oblique surface in the first direction and extends along the first direction,
   the ceramic layer being located on the first surface and on the oblique surface,
   a thickness of the ceramic layer on the oblique surface being less than a thickness of the ceramic layer on the first surface,
   an angle between the first surface and the oblique surface being greater than an angle between the perpendicular surface and the oblique surface.

2. The member according to claim 1, wherein the angle between the first surface and the oblique surface is not less than 160° and less than 180°.

3. The member according to claim 1, wherein the angle between the perpendicular surface and the oblique surface is greater than 90° and not more than 105°.

4. The member according to claim 1, wherein the ceramic layer includes a polycrystalline ceramic.

5. The member according to claim 4, wherein an average crystallite size of the polycrystalline ceramic calculated using a TEM image having a magnification of 400,000 times to 2,000,000 times is not less than 3 nanometers and not more than 50 nanometers.

6. The member according to claim 1, wherein the ceramic layer includes at least one selected from the group consisting of an oxide of a rare-earth element, a fluoride of a rare-earth element, and an acid fluoride of a rare-earth element.

7. The member according to claim 6, wherein the rare-earth element is at least one selected from the group consisting of Y, Sc, Yb, Ce, Pr, Eu, La, Nd, Pm, Sm, Gd, Tb, Dy, Ho, Er, Tm, and Lu.

8. The member according to claim 1, wherein the base material includes a ceramic.

9. The member according to claim 8, wherein the base material includes alumina.

10. A semiconductor manufacturing apparatus, comprising:
    a chamber; and
    the semiconductor manufacturing apparatus member according to claim 1,
    the chamber including an interior wall,
    the interior wall defining a space in which plasma is generated,
    the ceramic layer of the semiconductor manufacturing apparatus member being included in at least a portion of the interior wall.

\* \* \* \* \*